(12) United States Patent
Lim et al.

(10) Patent No.: US 12,534,801 B2
(45) Date of Patent: Jan. 27, 2026

(54) CHEMICAL SUPPLY DEVICE AND CHEMICAL SUPPLY SYSTEM INCLUDING THE SAME

(71) Applicant: RC-Tech Co., Ltd., Yongin-si (KR)

(72) Inventors: Tae Hwa Lim, Yongin-si (KR); Myeong Mun Kim, Incheon (KR); Jee Hun Kim, Icheon-si (KR)

(73) Assignee: RC-Tech Co., Ltd., Yongin-si (KR)

( * ) Notice: Subject to any disclaimer, the term of this patent is extended or adjusted under 35 U.S.C. 154(b) by 359 days.

(21) Appl. No.: 18/446,352

(22) Filed: Aug. 8, 2023

(65) Prior Publication Data
US 2024/0279803 A1  Aug. 22, 2024

(30) Foreign Application Priority Data
Feb. 20, 2023 (KR) .................. 10-2023-0022033

(51) Int. Cl.
| | |
|---|---|
| *B01F 23/23* | (2022.01) |
| *B01F 23/231* | (2022.01) |
| *C23C 16/448* | (2006.01) |
| *H01L 21/67* | (2006.01) |
| *C23C 16/40* | (2006.01) |

(52) U.S. Cl.
CPC ........ *C23C 16/4482* (2013.01); *B01F 23/231* (2022.01); *H01L 21/67017* (2013.01); *C23C 16/40* (2013.01)

(58) Field of Classification Search
CPC ..... B01F 23/23; B01F 23/231; C23C 16/4482
See application file for complete search history.

(56) References Cited

U.S. PATENT DOCUMENTS

| | | | | |
|---|---|---|---|---|
| 6,033,479 A | * | 3/2000 | Ikeda .................. | C23C 16/4482 134/22.12 |
| 7,971,861 B2 | * | 7/2011 | Soininen ............. | C23C 16/4481 261/DIG. 65 |
| 10,689,762 B2 | * | 6/2020 | Murata ............. | H01L 21/67017 |

FOREIGN PATENT DOCUMENTS

| | | |
|---|---|---|
| JP | 2022-91855 A | 6/2022 |
| KR | 10-1992-0022408 A | 12/1992 |
| KR | 10-2004-0021263 A | 3/2004 |

(Continued)

OTHER PUBLICATIONS

Office Action for KR 10-2023-0022033 by Korean Intellectual Property Office dated Apr. 22, 2024.

*Primary Examiner* — Robert A Hopkins
(74) *Attorney, Agent, or Firm* — BROADVIEW IP LAW, PC

(57) ABSTRACT

According to one embodiment, a chemical supply device includes: a bubbler configured to contain a chemical solution which is used in a semiconductor process and to receive an input gas for vaporizing the chemical solution into an output gas; a constant-temperature bath configured to contain the bubbler and to adjust a temperature of the chemical solution; a valve module fluidically connected with the bubbler and configured to provide channels for the chemical solution, the input gas, and the output gas; a level sensor configured to detect a remaining level of the chemical solution; a controller; and a memory configured to store a program for operating the controller, and the controller is configured to determine a target flow rate of the input gas to cause a flow rate of the output gas to have a designated flow rate, based on the remaining level of the chemical solution.

10 Claims, 15 Drawing Sheets

(56) References Cited

FOREIGN PATENT DOCUMENTS

| KR | 10-2009-0047682 A | 5/2009 |
|---|---|---|
| KR | 10-2018-0032853 A | 4/2018 |

* cited by examiner

CHEMICAL SUPPLY DEVICE AND CHEMICAL SUPPLY SYSTEM INCLUDING THE SAME

CROSS-REFERENCE TO RELATED APPLICATION(S)

This application is based on and claims priority under 35 U.S.C. § 119 to Korean Patent Application No. 10-2023-0022033, filed on Feb. 20, 2023, in the Korean Intellectual Property Office, the disclosure of which is herein incorporated by reference in its entirety.

BACKGROUND

Field

The disclosure relates to a chemical supply system which is used in a semiconductor manufacturing process.

This research was supported by the 2022 R&D Innopolis Promotion Program (Assignment identification No. 1711177841 & Assignment No. 2022-DD-RD-0249) through the Korea Innovation Foundation funded by the Ministry of Science and ICT.

Description of Related Art

In a semiconductor manufacturing process, a bubbler may be used to vaporize a chemical solution necessary for the process. The bubbler contains a toxic chemical solution therein, and vaporizes the chemical solution by receiving a fluid (for example, an inert gas). Maintaining a constant amount of chemical solution vaporized in the bubbler may result in enhancement of quality of the semiconductor manufacturing process.

SUMMARY

One object to be achieved by the disclosure is to maintain a constant amount of chemical solution vaporized in a bubbler.

Another object to be achieved by the disclosure is to guarantee compatibility of a chemical supply device and process equipment.

Still another object to be achieved by the disclosure is to measure a flow rate of an output gas and to determine an error of a chemical supply device based on the flow rate of the output gas.

According to various embodiments, there is provided a chemical supply device including: a bubbler configured to contain a chemical solution which is used in a semiconductor process and to receive an input gas for vaporizing the chemical solution into an output gas; a constant-temperature bath configured to contain the bubbler and to adjust a temperature of the chemical solution; a valve module fluidically connected with the bubbler and configured to provide channels for the chemical solution, the input gas, and the output gas; a level sensor configured to detect a remaining level of the chemical solution contained in the bubbler; a controller; and a memory configured to store a program for operating the controller, wherein the controller is configured to determine a target flow rate of the input gas to cause a flow rate of the output gas to have a designated flow rate, based on the remaining level of the chemical solution which is acquired from the level sensor.

According to various embodiments, there is provided a chemical supply system including: a chemical supply device, the chemical supply device including: a bubbler configured to contain a chemical solution which is used in a semiconductor process and to receive an input gas for vaporizing the chemical solution into an output gas; a constant-temperature bath configured to contain the bubbler and to adjust a temperature of the chemical solution; and a valve module fluidically connected with the bubbler and configured to provide channels for the chemical solution, the input gas, and the output gas; a gas supply unit configured to store the input gas to be introduced into the bubbler and connected with the bubbler; a chemical supply unit configured to store the chemical solution to be introduced into the bubbler; and process equipment fluidically connected with the bubbler through a process line to receive the output gas and perform a process; a flow rate sensor fluidically connected between the valve module and the bubbler and configured to measure a flow rate of the output gas transmitted to the process equipment; and a controller, wherein the controller is configured to determine an error of the chemical supply device based on flow rate information of the output gas which is acquired from the flow rate sensor.

According to various embodiments, there is provided a chemical supply system including: a chemical supply device, the chemical supply device including: a bubbler configured to contain a chemical solution which is used in a semiconductor process and to receive an input gas for vaporizing the chemical solution into an output gas; a valve module fluidically connected with the bubbler and configured to provide channels for the chemical solution, the input gas, and the output gas; and a level sensor configured to detect a remaining level of the chemical solution contained in the bubbler; a gas supply unit configured to store the input gas to be introduced into the bubbler and connected with the bubbler; and a flow rate adjustment module electrically connected with the level sensor and the gas supply unit, wherein the flow rate adjustment module is configured to determine a target flow rate of the input gas based on level information of the chemical solution acquired from the level sensor, and to transmit information related to the target flow rate to the gas supply unit, such that the input gas corresponding to the target flow rate is supplied.

According to various embodiments, a level of a chemical solution may be determined by using a level sensor, and a flow rate of an output gas may be uniformly adjusted based on the level of the chemical solution.

According to various embodiments, compatibility between a chemical supply device and process equipment may be guaranteed by using a flow rate adjustment module, and a flow rate of an input gas may be adjusted.

According to various embodiment, a flow rate of an output gas may be measured by using a flowmeter, and, based on the flow rate of the output gas, an error of a chemical supply device may be determined, or a flow rate of an input gas may be adjusted.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
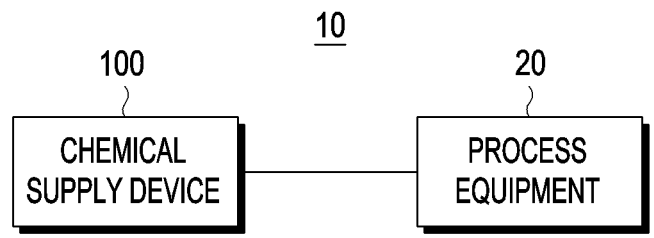
FIG. 1 is a block diagram illustrating a chemical supply system according to various embodiments.

Exemplary embodiments will now be described more fully with reference to the accompanying drawings to clarify the above-described objects, features and advantages of the disclosure. However, various changes may be made to the disclosure and various embodiments may be provided, and hereinafter, specific embodiments illustrated on the drawings will be described in detail.

In the drawings, thicknesses of layers and areas are exaggerated for the sake of clarity. In addition, it will be understood that when an element or a layer is referred to as being "on" another element or layer, the element may be directly on another element or layer or an intervening element or layer interposed therebetween. Throughout the specification, the same reference numerals indicate the same elements in principle. In addition, elements having the same function within the scope of the same technical concept, illustrated on the drawings of respective embodiments, will be described by using the same reference numeral.

Detailed explanations of well-known functions or constructions related to the disclosure are omitted when it is deemed that they may unnecessarily obscure the essence of the disclosure. Numbers used in the detailed descriptions of the disclosure (for example, such terms as 'first' and 'second') are merely identification signs for distinguishing one element from another element.

The terms "area," "portion," "unit" and the terms having suffix "-er" or "-or" used in the detailed descriptions of the disclosure are given or interchangeably used only by considering easiness of drafting of the application, and does not have distinct meanings or roles in themselves.

Figure 2:
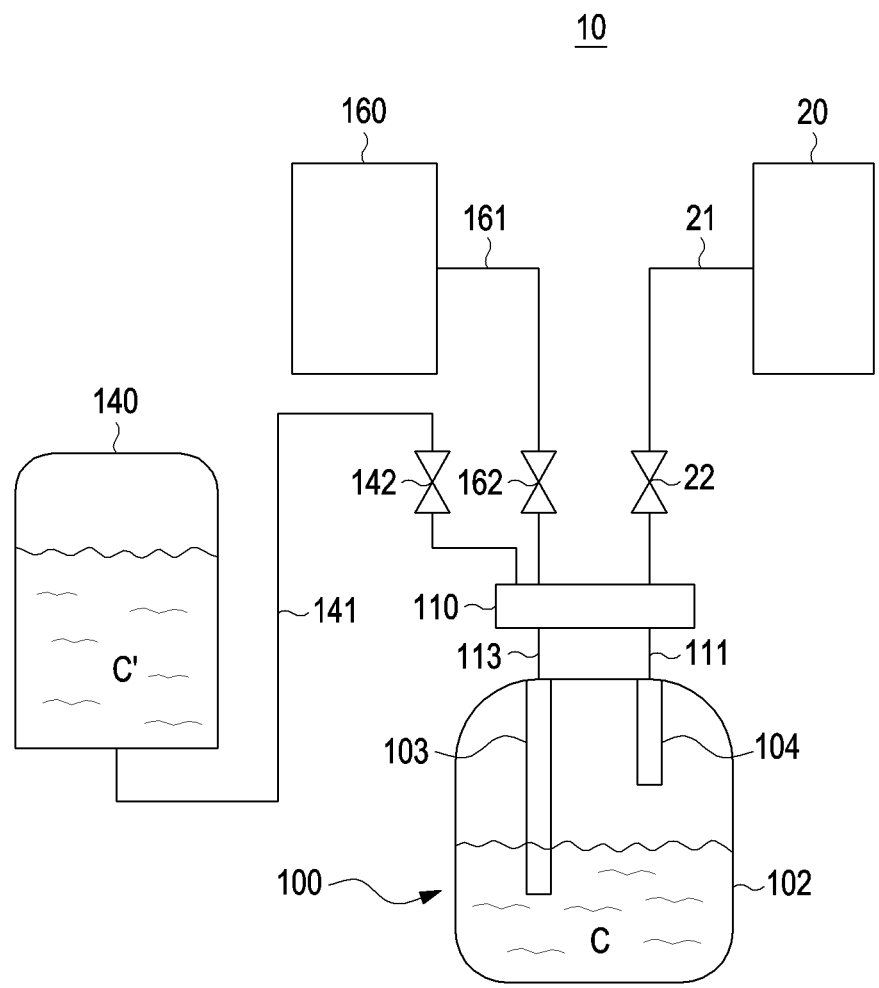
FIG. 2 is a view illustrating an implementation example of the chemical supply system according to various embodiments.

FIG. 1 is a block diagram illustrating a chemical supply system according to various embodiment. FIG. 2 is a view illustrating an implementation example of the chemical supply system according to various embodiments.

Referring to FIGS. 1 and 2, the chemical supply system 10 may include all or part of a chemical supply unit 140, a gas supply unit 160, a chemical supply device 100, and process equipment 20.

According to various embodiments, the chemical supply system 10 may store a chemical solution C, may vaporize the stored chemical solution C, and may transfer the vaporized chemical solution C to the process equipment 20. The vaporized chemical solution C may be used for a semiconductor manufacturing process in the process equipment 20. In an embodiment, the process equipment 20 may be used in a wafer diffusion process. For example, the process equipment 20 may be a diffusion furnace. However, this should not be considered as limiting, and the process equipment 20 may be used in various semiconductor process equipment.

According to various embodiments, the chemical supply device 100 may include a bubbler 102 and a valve module 110. The bubbler 102 may contain the chemical solution C. In an embodiment, the bubbler 102 may be fluidically connected with the valve module 110. The valve module 110 may adjust a fluid movement between the chemical supply unit 140 and the gas supply unit 160, and the bubbler 102. In a certain embodiment, the bubbler 102 may include a quartz material.

According to various embodiments, the chemical supply unit 140 may be provided as a reservoir of a chemical solution C'. The chemical supply unit 140 may store a large amount of chemical solution C', and may transfer the chemical solution C' that is necessary for a vaporization process of the chemical solution C performed in the chemical supply device 100 to the chemical supply device 100. In this case, the chemical supply unit 140 may start transferring the chemical solution C' in response to a request of the process equipment 20 and/or the chemical supply device 100. In an embodiment, the chemical supply unit 140 may include a chemical line 141 and a chemical auxiliary valve 142. The chemical line 141 may fluidically connect between the chemical supply unit 140 and the valve module 110. In a certain embodiment, the chemical auxiliary valve 142 may be opened or closed in response to a request of the chemical supply unit 140 and/or the chemical supply device 100. In a certain embodiment, the chemical supply unit 140 may transfer the stored chemical solution C' to the chemical supply device 100, based on level information of the chemical solution C that is measured by a level sensor (for example, a level sensor 1010 of FIG. 3). For example, when the level of the chemical solution C stored in the bubbler 102 is lower than a pre-defined level, the chemical supply unit 140 may supply the stored chemical solution C' to the bubbler 102.

According to various embodiments, the gas supply unit 160 may store and supply a gas for vaporizing the chemical solution C contained in the bubbler 102. Herein, the gas for vaporizing the chemical solution C may be provided as an inert gas (for example, nitrogen (N2)), but this should not be considered as limiting and various gases may be transferred. In addition, the gas supply unit 160 may store a gas for directly using in the semiconductor manufacturing process, and may supply the gas to the bubbler 102 or the process equipment 20. For example, the gas supply unit 160 may directly supply a gas that acts on a wafer (for example, a production wafer 21 of FIG. 13) and is used in a diffusion process to the process equipment 20. In this case, the gas supply unit 160 may initiate gas supply in response to a request of the chemical supply device 100 and/or the process equipment 20. In an embodiment, the gas supply unit 160 may include a gas supply line 161 and a gas auxiliary valve 162. The gas supply line 161 may fluidically connect between the gas supply unit 160 and the valve module 110. The gas auxiliary valve 162 may be opened or closed in response to a request of the gas supply unit 160 and/or the chemical supply device 100. In a certain embodiment, the gas supply unit 160 may include a mass flow controller. The gas supply unit 160 may measure and control a flow velocity of a gas that is transferred to the chemical supply device 100 and/or the process equipment 20.

According to various embodiments, the valve module 110 may be mounted on the bubbler 102, and may adjust a fluid flow between the bubbler 102 and the chemical supply unit 140, the gas supply unit 160, and the process equipment 20. In an embodiment, the valve module 110 may receive the chemical solution C from the chemical supply unit 140, and may supply the chemical solution C to an inlet tube 103 through an inlet line 113 and may transfer the chemical solution C to the inside of the bubbler 102. In addition, the valve module 110 may receive a gas from the gas supply unit 140, and may supply the gas to the inlet tube 103 through the inlet line 113 and may supply the gas to the bubbler 102. The valve module 110 may selectively transfer the chemical solution C or gas to the inside of the bubbler 102 through the inlet line 113. In an embodiment, the valve module 110 may be fluidically connected with the chemical line 141 and/or the gas supply line 161, and may selectively transfer the chemical solution C or gas to the inside of the bubbler 102 through the inlet line 113.

According to various embodiments, the valve module 110 may be fluidically connected with an outlet 104 of the bubbler 102 through an outlet line 111. The valve module 110 may be fluidically connected with the process equipment 20 through a process line 21. The valve module 110 may adjust transfer of a fluid between the bubbler 110 and the process equipment 20. In an embodiment, a gas for vaporizing the chemical solution C (hereinafter, referred to as an 'input gas') may be introduced into the bubbler 102, and, when the chemical solution C is vaporized, the vaporized chemical solution C may be transferred to the valve module 110 through the outlet tube 104 and the outlet line 111. Herein, the valve module 110 may adjust a fluid movement passage to transfer the vaporized chemical solution C to the process equipment 20 through the process line 21. In a certain embodiment, an auxiliary process valve 22 may be disposed between the valve module 110 and the process line 21. The auxiliary process valve 22 may be opened or closed according to a request of the chemical supply device 100 and/or the process equipment 20, and may adjust a fluid movement between the valve module 110 and the process equipment 20.

Figure 3:
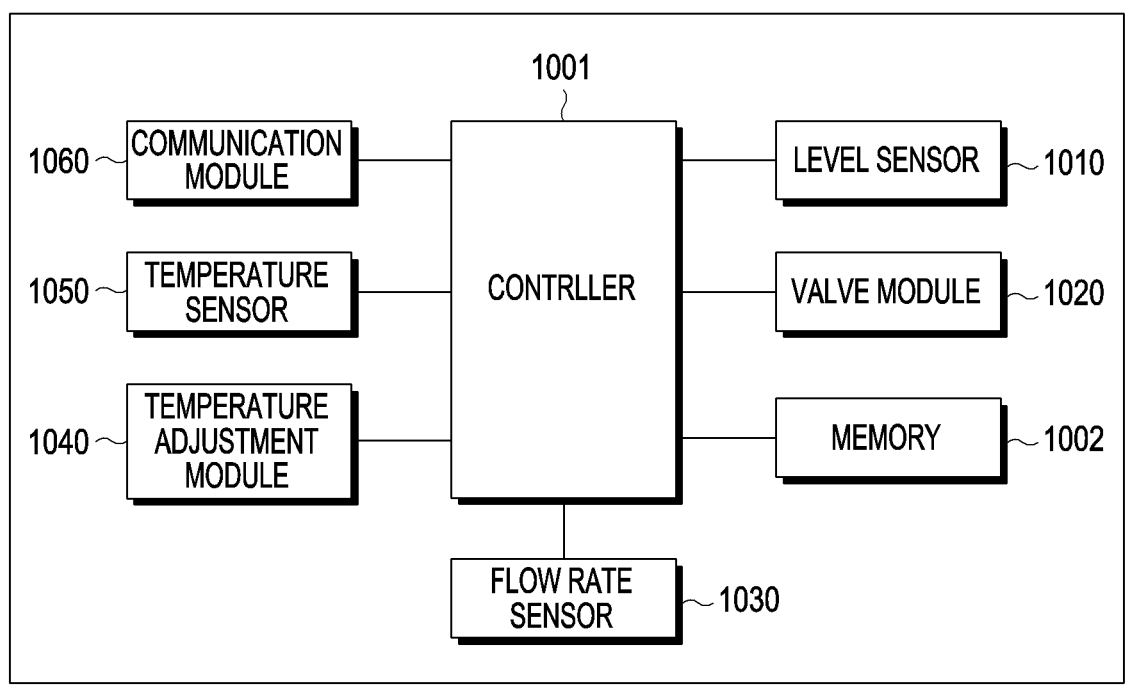
FIG. 3 is a block diagram illustrating a configuration of a chemical supply device according to various embodiments.

FIG. 3 is a block diagram illustrating a configuration of a chemical supply device according to various embodiments.

Referring to FIG. 3, the chemical supply device 100 may include all or part of a controller 1001, a level sensor 1010, a valve module 1020, a flow rate sensor 1030, a temperature adjustment module 1040, a temperature sensor 1050, a communication module 1060, and a memory 1002. The chemical supply device 100 of FIG. 3 is the same as or similar to the chemical supply device 100 described in FIGS. 1 and 2 in its entirety or in part. In explaining FIG. 3, reference numerals used in FIGS. 1 and 2 may also be mentioned.

According to various embodiments, the level sensor 1010 may measure a capacity of a chemical solution C stored in the chemical supply device 100. In an embodiment, the level sensor 1010 may detect a level of the chemical solution C contained in the bubbler 102. In a certain embodiment, the level sensor 1010 may be implemented by a level sensor (for example, a capacitive measuring method) which is disposed inside the bubbler 102. In another example, the level sensor 1010 may be a level sensor (for example, a level sensor 230 of FIG. 6) of a light measuring method that includes a light emitter and a light receiver. The level sensor 1010 may measure a remaining capacity of the chemical solution C stored in the chemical supply device 100, and may transmit information related thereto to the controller 1001. In another example, the level sensor 1010 may transmit the information related to the remaining capacity of the chemical solution C to a controller (for example, a main controller 801 of FIG. 13) of the process equipment 20. This will be described in detail.

The valve module 1020 of FIG. 3 may have the same or similar configuration as or to that of the valve module 110 described in FIG. 2 in its entirety or in part. According to various embodiments, the valve module 1020 may be connected with the controller 1001, and may adjust movement of an input gas and/or the chemical solution C to the inside of the chemical supply device 100 in response to a request of the controller 1001.

According to various embodiments, the flow rate sensor 1030 may measure a flow rate of the vaporized chemical solution C that is outputted from the chemical supply device 100. In an embodiment, the flow rate sensor 1030 may be disposed between the valve module 1020 and the outlet line 111, and may measure a flow rate of the vaporized chemical solution C that is transferred to the valve module 1020 through the outlet line 111. Information related to the measured flow rate may be transmitted to the controller 1001. This will be described below.

According to various embodiments, the temperature adjustment module 1040 may adjust a temperature of the chemical supply device 100. In an embodiment, the temperature adjustment module 1040 may adjust the temperature of the chemical solution C contained in the bubbler 102. For example, the temperature adjustment module 1040 may be disposed in a constant-temperature bath (for example, a constant-temperature bath 202 of FIG. 6) containing the bubbler 1020, and may increase or reduce the temperature of the chemical solution C.

According to various embodiments, the temperature sensor 1050 may measure an internal temperature of the chemical supply device 100. In an embodiment, the temperature sensor 1050 may measure a temperature of the chemical solution C contained in the bubbler 102. Information related to the measured temperature may be transmitted to the controller 1001, and the controller 1001 may control the temperature adjustment module 1040 to adjust the temperature of the chemical solution C.

According to various embodiments, the communication module 1060 may communicate with an external device. The chemical supply device 100 may transmit or receive data to or from the process equipment 20 or an external device through the communication module 1060. For example, the chemical supply device 100 may transmit an electrical signal including information related to a level of the chemical solution C to the process equipment 20 through the communication module 1060. In a certain embodiment, the communication module 1060 may perform communication with the gas supply unit 160 and/or the chemical supply unit 140, and may transmit a signal for supplying the input gas and/or the chemical solution C.

The communication module 1060 may be divided into a wire type and a wireless type. Since the wire type and the wireless type have their respective advantages and disadvantages, the wire type and the wireless type may concurrently be provided in the chemical supply device 100 according to circumstances. Herein, local area network (LAN) or universal serial bus (USB) communication is a representative example of the wire type, and other communication methods are possible. In a certain embodiment, the communication module 1060 may use an Ethernet or EtherCAT protocol. The wireless type may use a communication method of wireless personal area network (WPAN), such as Bluetooth or Zigbee. However, the wireless communication protocol is not limited thereto and the communication module of the wireless type may use a communication method of wireless local area network (WLAN) such as Wi-Fi, or other well-known communication methods.

According to various embodiments, the memory 1002 may store a variety of information. The memory 1002 may temporarily or semi-permanently store various data. For example, the memory 1002 may be a hard disk drive (HDD), a solid state drive (SSD), a flash memory, a read only memory (ROM), a random access memory (RAM), or the like. The memory 1002 may be embedded in the chemical supply device 100 or may be provided in an attachable and detachable form.

According to various embodiments, the memory 1002 may store various data necessary for operations of the chemical supply device 100, including an operating system (OS) for driving the chemical supply device 100 or a program for operating respective components of the chemical supply device 100. For example, the memory 1002 may store data related to a temperature measured at the temperature sensor 1050, a level measured at the level sensor 1010.

The controller 1001 may control overall operations of the chemical supply device 100. For example, the controller 1001 may load a program for operations of the valve module 1020 from the memory 1002 and may execute the program, or may generate a control signal for supplying an input gas and/or a chemical solution from the gas supply unit 160 and/or the chemical supply unit 140.

The controller 1001 may be implemented by a central processing unit (CPU) or a similar device according to hardware or software or a combination thereof. In a hardware level, the controller 1001 may be provided in the form of an electronic circuit to process an electrical signal and perform a control function, and, in a software level, the controller 1001 may be provided in the form of a program or a code to operate a hardware circuit.

The chemical supply device 100 may have a separate power source unit or may receive power from an external source wiredly or wirelessly, and may have a separate switch to control the power source unit.

In a semiconductor manufacturing process, there may be a need for regularly adjusting a flow rate of an output gas and supplying a uniform gas to wafers (for example, the production wafer 21 of FIG. 13) arranged within the process equipment 20. As the uniform output gas is supplied to the wafer 21, quality of the wafers 21 going through a diffusion process may be enhanced.

In order to adjust a flow rate of an output gas outputted from the chemical supply device 100, a flow rate of an input gas reacting to the chemical solution C may be adjusted, or a water level of the chemical solution C contained in the bubbler 102 may be adjusted. Alternatively, a temperature of the chemical solution C may also be adjusted. Hereinafter, various methods for guaranteeing a uniform flow rate of an output gas by adjusting a flow rate of an input gas based on a remaining amount of the chemical solution C contained in the bubbler 102 will be mainly described. However, this is for the convenience of explanation. It should be noted that embodiments described below may be applied to an operation of refilling the chemical supply device 100 with the chemical solution C' from the chemical supply unit 140 in order to make a remaining amount of the chemical solution C contained in the bubbler 102 uniform. In addition, it will also be understood that the flow rate of the output gas can be uniformly adjusted by a combination of the method of adjusting the flow rate of the input gas and the method of refilling.

Hereinafter, a method of adjusting a flow rate of an input gas, which is performed in the chemical supply device 100, will be described.

Figure 4:
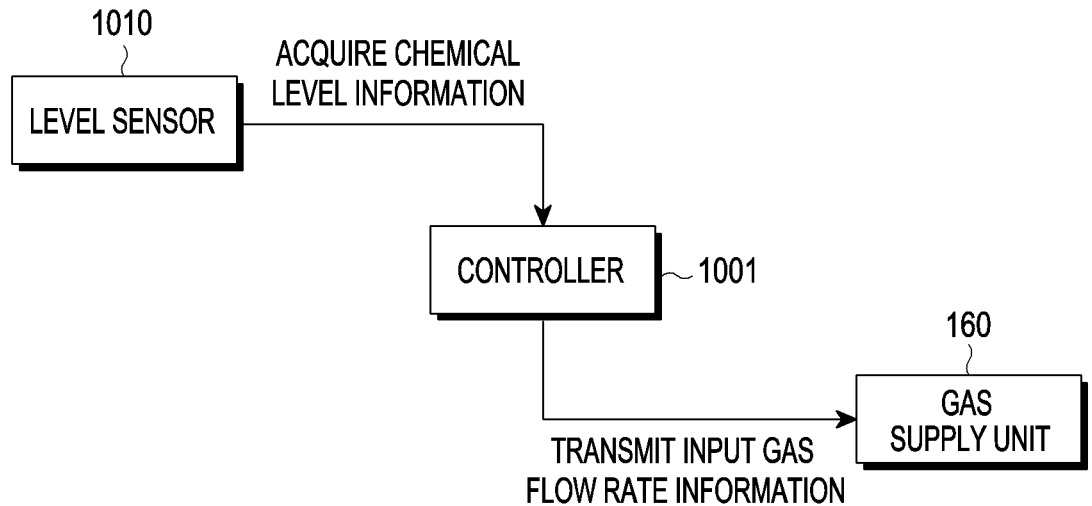
FIG. 4 is a view illustrating operations of the chemical supply device according to various embodiments.
Figure 5:
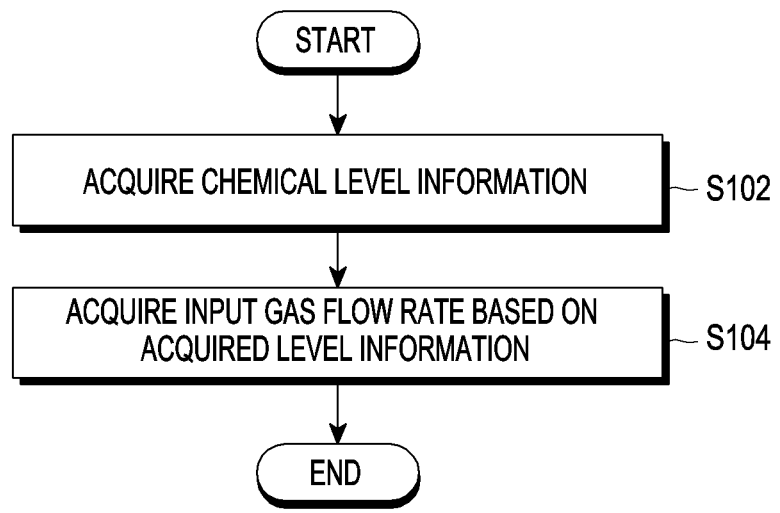
FIG. 5 is a flowchart illustrating an operating method of the chemical supply system according to various embodiments.

FIG. 4 is a view illustrating operations of the chemical supply device according to various embodiments. FIG. 5 is a flowchart illustrating an operating method of the chemical supply system according to various embodiments.

Referring to FIGS. 4 and 5, the operating method of the chemical supply system according to various embodiments may include a step of acquiring chemical level information (S102), and a step of determining flow rate information of an input gas, based on the acquired level information. In explaining FIGS. 4 and 5, reference numerals used in FIGS. 1 to 3 may also be mentioned.

According to various embodiment, the chemical supply device 100 may adjust a flow rate of an input gas based on a level of the chemical solution C. In an embodiment, the controller 1001 may acquire level information of the chemical solution C stored in the bubbler 1002 from the level sensor 1010. The controller 1001 may determine information on an appropriate flow rate (for example, a flow velocity) of the input gas based on the acquired level information, and may transmit the flow rate information of the input gas to the gas supply unit 160 and/or the valve module 110, 1010.

According to various embodiments, an amount of the chemical solution C to be vaporized by the input gas may be influenced by various factors. For example, the amount of the chemical solution C to be vaporized may be changed according to all or part of a temperature, a capacity of a remaining chemical solution, a flow rate of the input gas. For the convenience of explanation, the vaporized chemical solution C that is transmitted to the process equipment 20 will be referred to as an "output gas."

In an embodiment, the bubbler 102 and the chemical solution C in the bubbler 102 may be maintained at a constant temperature by the chemical supply device 100 having the temperature sensor 1050 and the temperature adjustment module 1040 mounted therein. When the constant temperature of the chemical solution C contained in the bubbler 102 is maintained, the amount of the chemical solution C to be vaporized may be determined by a capacity of a remaining chemical solution C and a flow rate of the input gas applied to the chemical solution C. Herein, maintaining the flow rate of the vaporized chemical solution C to be transmitted to the process equipment 20 uniformly, or adjusting the flow rate of the vaporized chemical solution with a minor change may be advantageous to performing a manufacturing process with good quality and reducing a defect in the semiconductor manufacturing process. In an embodiment, the chemical supply device 100 may detect a level of the chemical solution C in the bubbler 102 and may adjust a flow rate of the input gas based on the level of the chemical solution C in order to transfer a constant amount of the vaporized chemical solution C to the process equipment 20.

According to various embodiments, the controller 1001 may determine the flow rate of the input gas by using a program or data stored in the memory 1002. In the following description, the flow rate of the input gas that is determined to uniformly maintain the amount of the chemical solution C to be vaporized may be referred to as a 'target flow rate' for the convenience of explanation. In an embodiment, the memory 1002 may store information on the target flow rate corresponding to the level of the chemical solution C in the form of a lookup table. In another example, the memory 1002 may store a program for calculating a target flow rate based on the level of the chemical solution C that is consecutively reduced.

Hereinafter, implementation examples of the chemical supply device 100 which detects a level of the chemical solution C and determines a target flow rate based on the level of the chemical solution C will be described.

Figure 6:
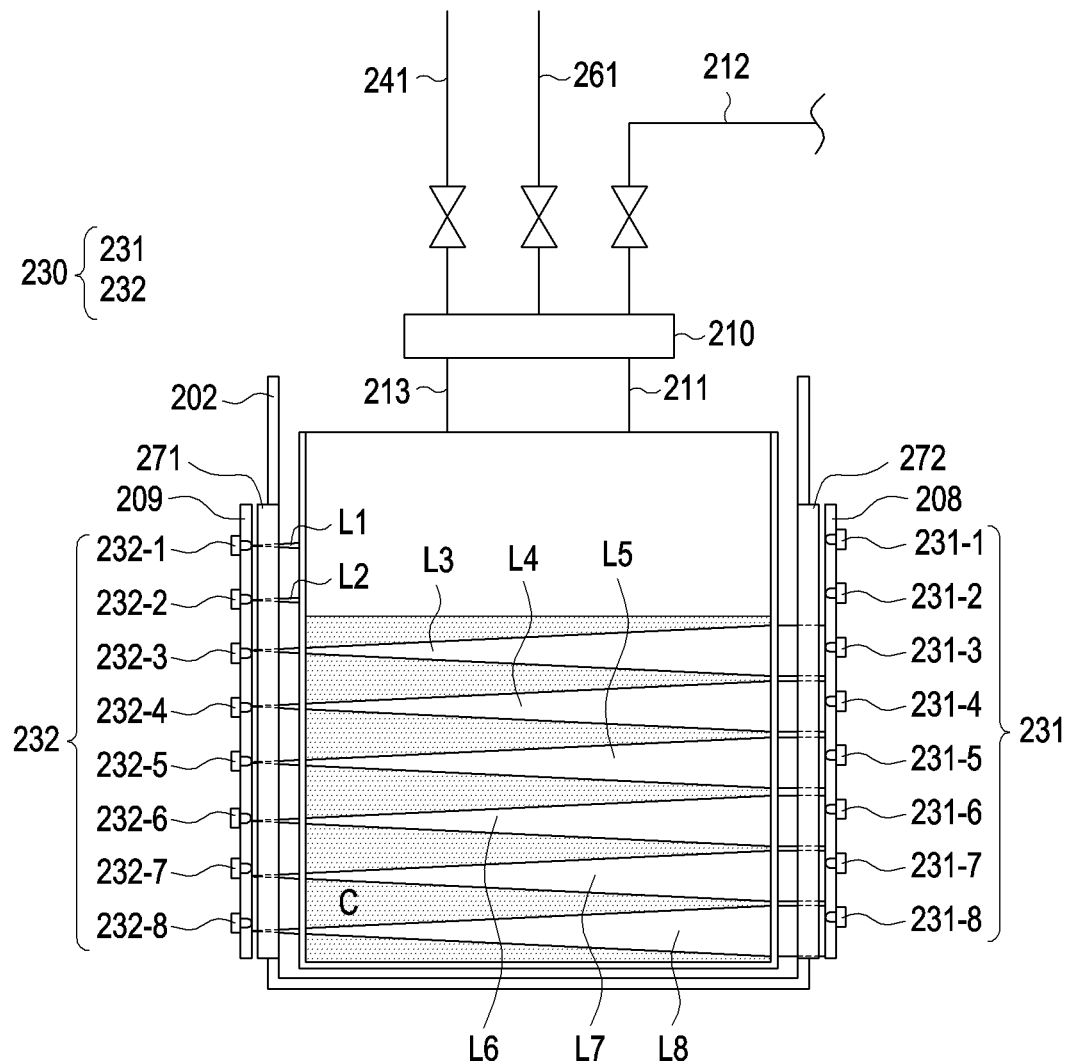
FIG. 6 is a view illustrating an implementation example of a chemical supply device according to a first embodiment.
Figure 7:
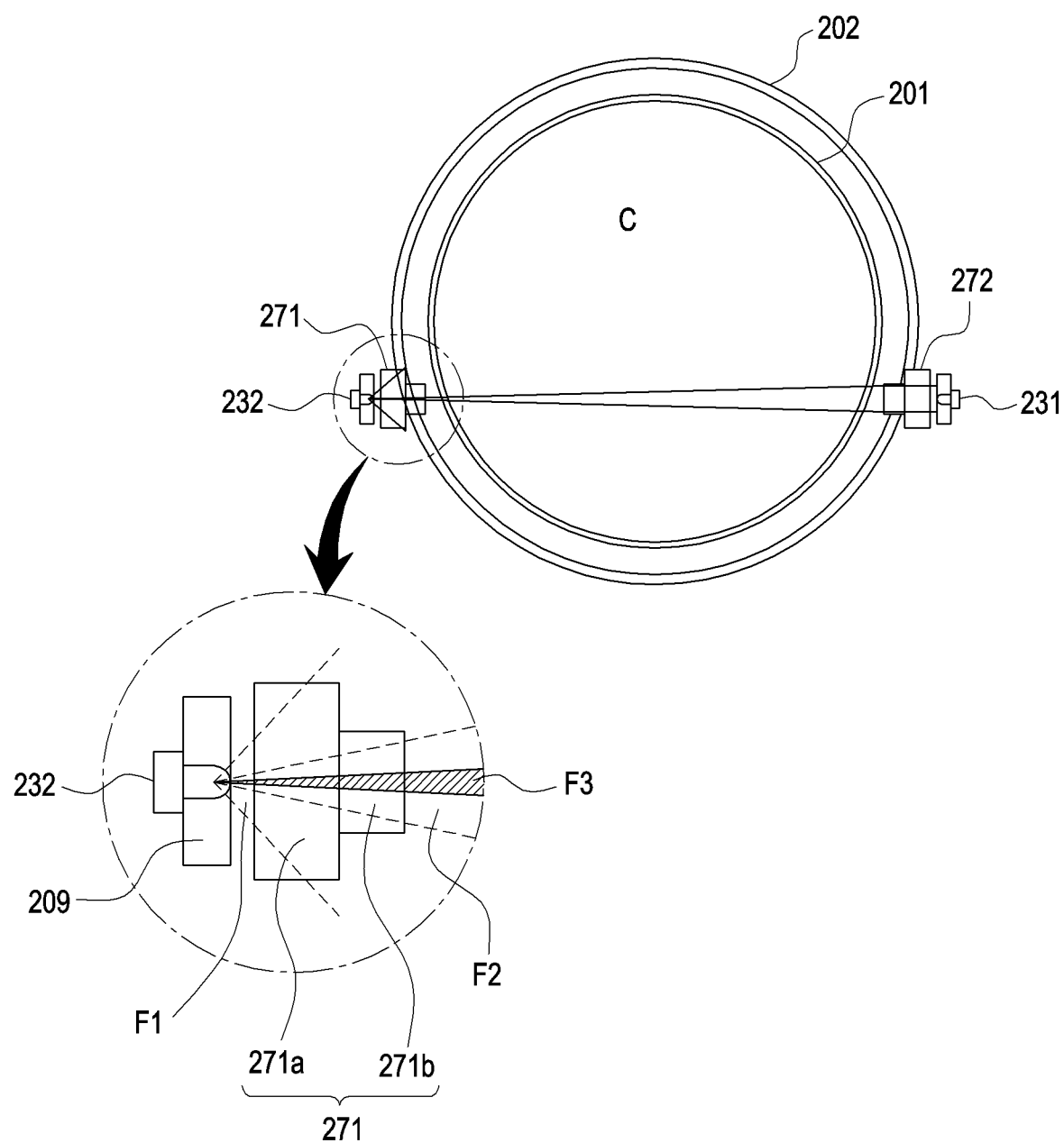
FIG. 7 is a view of the chemical supply device of FIG. 6 as viewed from above.
Figure 8:
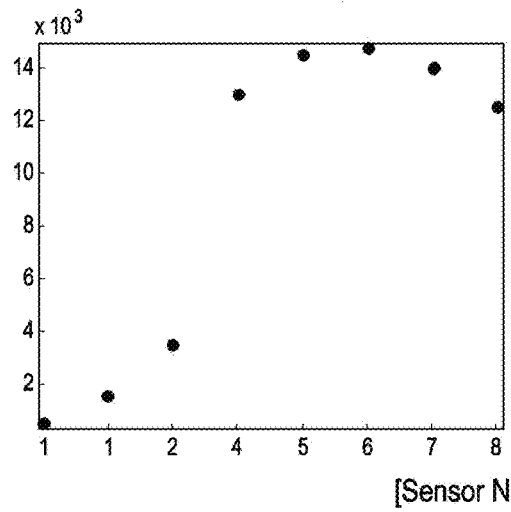
FIG. 8 is a view illustrating examples of interpolation methods for measuring a water level according to various embodiments.
Figure 8:
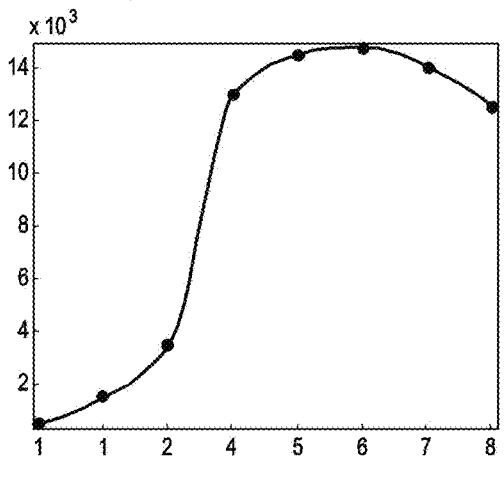
Figure 8:
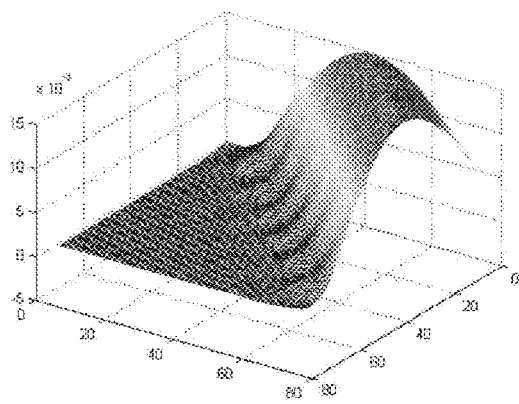
Figure 8:
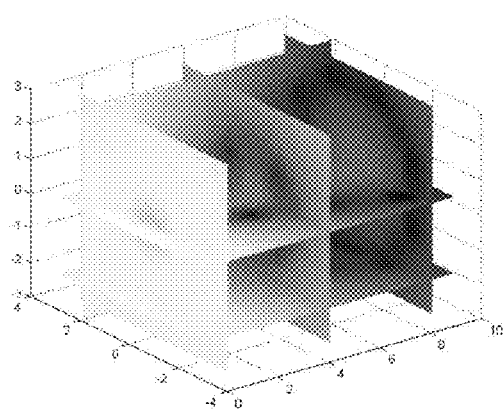

FIG. 6 is a view illustrating an implementation example of a chemical supply device according to a first embodiment. FIG. 7 is a view of the chemical supply device of FIG. 6 as viewed from above. FIG. 8 is a view illustrating examples of interpolation methods for measuring a water level according to various embodiments.

Referring to FIGS. 6 to 8, the chemical supply device 200 may include all or part of a constant-temperature bath 202, a bubbler 201 contained in the constant-temperature bath 202, a level sensor 230 disposed in the proximity of the bubbler 201, and a valve module 210. Explanation of the chemical supply device 100 described in FIGS. 1 to 5 may be applied to the chemical supply device 200 of FIG. 2.

According to various embodiments, the constant-temperature bath 202 may contain the bubbler 201. The constant-temperature bath 202 may include a temperature sensor (for example, the temperature sensor 1050 of FIG. 3) and a temperature adjustment module (for example, the temperature adjustment module 1040 of FIG. 3) to maintain a temperature of the bubbler 201 and a temperature of a chemical solution C contained in the bubbler 201.

According to various embodiments, the level sensor 230 may be disposed in the proximity of the bubbler 201. For example, the level sensor 230 may be disposed on a sidewall of the constant-temperature bath 202 adjacent to the bubbler 201.

According to various embodiments, the level sensor 230 may include all or part of a light emitter 232, a light receiver 231, and a light conversion member 271. According to an embodiment, light outputted from the light emitter 232 may pass through the inside of the bubbler 201 and may enter the light receiver 231. The light emitter 232 may include a plurality of light emitters 232-1 to 232-8 which are spaced apart from one another. The light receiver 231 may include a plurality of light receivers 231-1 to 231-8 corresponding to the plurality of light emitters 232-1 to 232-8. The light emitters 232 and the light receivers 231 may be disposed to face each other, respectively. For example, the light emitters 232 and the light receivers 231 may be disposed at the same height, respectively. In an embodiment, the plurality of light emitters 232-1 to 232-8 may be disposed on a first circuit board 209. For example, the plurality of light emitters 232-1 to 232-8 may be disposed on the first circuit board 209 which is integrally formed. In another example, the first circuit board 209 may be physically divided, and at least one or more light emitters 232-1 to 232-8 may be disposed on each of the divided first circuit boards 209. Explanation of the relationship between the first circuit board 209 and the plurality of light emitters 232-1 to 232-8 may be applied to a relationship between the plurality of light receivers 231-1 to 231-8 and a second circuit board 208. In a certain embodiment, the light emitter 232 may be provided as an infrared light emitting diode (LED) so as to allow light to easily pass through the bubbler 201 of a quartz material, but this should not be considered as limiting and various light emitting elements may be used.

In an embodiment, the controller 1001 may determine a level of the chemical solution C, based on an amount of light entering the plurality of light receivers 232. In an embodiment, each of the light receivers 231 may reflect a specific level of the chemical solution C. The level of the chemical solution C reflected by data measured at the light receiver 231 may be pre-acquired and may be stored as initial level data. This will be described below. For example, when an intensity of light entering the first light receiver 231-1, which is disposed at the uppermost end, is lower than an intensity of light emitted from the first light emitter 232-1 corresponding to the first light receiver 231-1 by a threshold value or more, it may be determined that there exists the chemical solution C between the first light emitter 232-1 and the first light receiver 231-1, and the controller 1001 may determine a height to the first light receiver 231-1 disposed at the uppermost end as a remaining level of the chemical solution C.

In an embodiment, the first to eighth light receivers 231-1 to 231-8 may reflect respective specific water levels. In addition, the first to eighth light emitters 232-1 to 232-8 may reflect respective specific water levels. Specifically, when an uppermost end (level) of the chemical solution C lies between the second light receiver 231-2 (or the second light emitter 232-2 disposed in parallel to the second light receiver 231-2) and the third light receiver 231-3 (or the third light emitter 232-3 disposed in parallel to the third light receiver 231-3), the controller 1001 may determine a height corresponding to the third light receiver 231-3 as a level of the remaining chemical solution C. In a certain embodiment, the controller 1001 may determine an accurate level of the chemical solution C, based on information acquired at the light receiver 231, which will be described below.

In a certain embodiment, the first to eighth light emitters 232-1 to 232-8 and/or the first to eighth light receivers 231-1 to 231-8 may be disposed at regular intervals from one another. For example, the first to eighth light receivers 231-1 to 232-8 may be disposed at intervals of about 11% to 12% of the level of the bubbler 201. In other words, the interval between the two adjacent light receivers 231 (or light emitters 232) may be about 11% to 12% of the height of the bubbler 201.

According to various embodiments, a first light conversion member 271 may be disposed between the light emitter 232 and the bubbler 201, and/or a second light conversion member 272 may be disposed between the light receiver 231 and the bubbler 201. The first light conversion member 271 and the second light conversion member 272 may have a symmetrical structure and may perform the same or similar function, and hence, the first light conversion member 271 will be mainly described.

According to various embodiments, the first light conversion member 271 may adjust a light path of light (for example, a first light L1 to an eighth light L8) outputted from the light emitter 232. In an embodiment, the first light conversion member 271 may collect light outputted from the light emitter 232 and may adjust a light path to transmit the light to the light receiver 231. For example, light emitted from the third light emitter 232-3 may be collected by passing through the first light conversion member 271, and the path light may be adjusted to transmit the light to the third light receiver 231-3. It will be understood that the same explanation is equally applied to the first to eighth light emitters 232-1 to 232-8 and the first to eighth light receivers 231-1 to 231-8.

According to various embodiment, the first light conversion member 271 may include a light collector 271a and an adjuster 271b. In an embodiment, the light collector 271a may be disposed close to the light emitter 232, and may receive light F1 emitted from the light emitter 232 and may collect the light. The light F2 collected at the light collector 271a may be transmitted to the adjuster 271b which is physically and/or optically connected with the light collector 271a, and the adjuster 271b may adjust a light path of the collected light F2. Light F3 for which the light path is adjusted may enter the light receiver 231 corresponding to the light emitter 232. To this end, a loss of the intensity of light entering the light receiver 231 from the light emitter 232 may be reduced. In addition, light interference (or noise) that is transmitted to adjacent plural light receivers (for example, the first light receiver 231-1, the second light receiver 231-2) may be reduced.

In a certain embodiment, the first light conversion member 271 may be disposed within a sidewall of the constant-temperature bath 202. For example, the first light conversion member 271 may be provided as a window to optically connect between the light emitter 232 and the bubbler 201. In an embodiment, the first light conversion member 271 may be integrally formed, and light outputted from the plurality of light emitters 232-1 to 232-8 may pass through one first light conversion member 271 and may be transmitted to the plurality of light receivers 231-1 to 231-8. In another embodiment, the first light conversion member 271 may be provided as two or more physically divided configurations. For example, the divided first light conversion members 271 may allow only light emitted from specific light emitters 232-1 to 232-8 to pass therethrough, respectively. More specifically, the first light conversion member 271 may be divided into eight members to correspond to the first to eighth light emitters 232-1 to 232-8, respectively.

According to various embodiments, the chemical supply device 200 may calculate a level of the chemical solution C, based on optical information acquired at the level sensor 230. For example, the controller 1001 may determine the level of the chemical solution C, based on optical information measured at all or part of the light receivers 231-1 to 231-8. In the following descriptions, information that is measured at the level sensor 230 (for example, the light receiver 231) may be referred to as 'sensing data' for the convenience of explanation.

According to various embodiments, the chemical supply device 100 may determine the level of the chemical solution C, based on initial level data stored in the memory 102 and sensing data acquired from the level sensor 1020. In an embodiment, the initial level data which is pre-measured and stored may refer to data that matches the level of sensing data measured at the level sensor 230. For example, the initial level data may be sensing data that is measured when the chemical solution C is contained in the bubbler at various levels. According to an embodiment, there may be a need for determining a level of a remaining chemical solution C that is not included in the initial level data, or precisely measuring a water level of the chemical solution C that shakes when the chemical solution is vaporized. In a certain embodiment, the controller 1001 may determine an accurate level of the chemical solution C by using the initial level data and the sensing data.

According to various embodiments, the level may be determined not only by using the initial level and the sensing data but also by interpolating the sensing data. In an embodiment, the controller 1001 may determine the level of the chemical solution C by interpolating the sensing data which is measured at the first to eighth light receivers 231-1 to 231-8. Herein, the controller 1001 may use a combination of all or part of linear interpolation, spline interpolation, smoothing spline interpolation, and/or Hermite interpolation. In a certain embodiment, the controller 1001 may determine the level of the chemical solution C by further considering spectrum characteristics of an infrared sensor, a distribution of detection of the light receiver 231.

In a certain embodiment, the controller 1001 may adjust the target flow rate of the input gas based on level information of the chemical solution C which is acquired at the light receiver 231. Herein, the controller 1001 may load, from the memory 1002, a target flow rate corresponding to level information indicated by the first to sixth light receivers 231-1 to 232-6 (for example, 90% level indicated by the first light receiver 231-1), and may transmit a control signal to a gas supply unit (for example, the gas supply unit 160 of FIG. 2), and/or the valve module 210. The gas supply unit 160 and/or the valve module 210 which receives the control signal may adjust a flow rate of the input gas to correspond to the target flow rate, and accordingly, the input gas passing through an inlet tube 203 may be applied to the chemical solution C at the target flow rate. In a certain embodiment, the gas supply unit 160 may directly transfer the input gas to correspond to the target flow rate, and the input gas having the target flow rate may pass through the valve module 210 and may be transferred to the inlet tube 203. In another example, the input gas that is transferred to the valve module 210 through a gas supply line 261 may have its flow rate changed at the valve module 210 and may be transferred to the inlet tube 203. In another example, the gas that is transferred from the gas supply unit 160 may have its flow rate controlled at an auxiliary gas valve.

In a certain embodiment, when the chemical solution C lies between the first light receiver 231-1 and the second light receiver 231-2, the controller 1001 may control such that the input gas is transferred at a first target flow rate, and, when the chemical solution C lies between the second light receiver 231-2 and the third light receiver 231-3, the controller 1001 may control such that the input gas is transferred at a second target flow rate.

In a certain embodiment, the controller 1001 may transmit a refill signal of the chemical solution C to a chemical supply unit (for example, the chemical supply unit 140 of FIG. 2), based on level information of the chemical solution C. For example, when it is determined that the level of the chemical solution C acquired at the light receiver 231 is less than or equal to a threshold level, the controller 1001 may transmit a control signal for supplying the chemical solution to the chemical supply unit 140.

Figure 9:
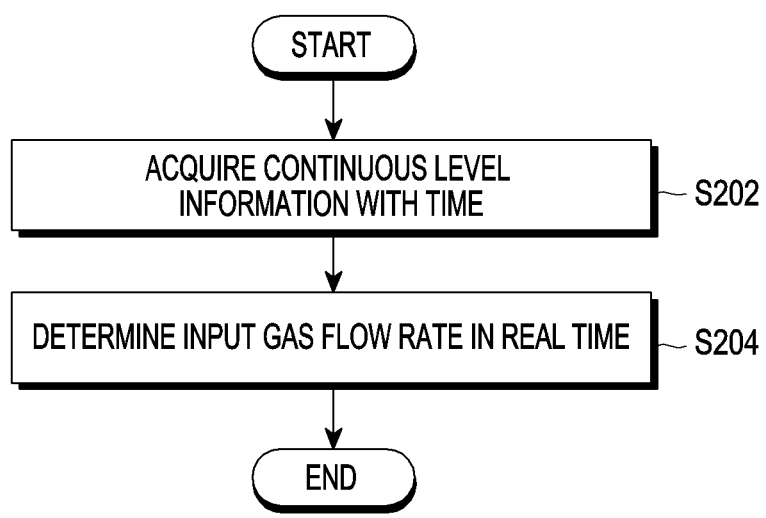
FIG. 9 is a flowchart illustrating an operating method of a chemical supply device according to another embodiment.

FIG. 9 is a flowchart illustrating an operating method of a chemical supply device according to another embodiment.

Referring to FIG. 9, the operating method of the chemical supply device 100 may include a step of acquiring continuous level information with time (S202), and a step of determining a flow rate of an input gas in real time (S204). In explaining an embodiment of FIG. 8, contents described in FIGS. 1 to 7 will be referred to or combined.

According to various embodiments, the chemical supply device 100 may acquire continuous level information with time. For example, the chemical supply device 100 may measure a minute change in the chemical solution C that is reduced as an input gas is introduced. The controller 1001 may acquire information on a change in the level of the chemical solution C contained in the bubbler 102 in real time from the level sensor 1010.

According to various embodiments, the chemical supply device 100 may determine a target flow rate of the input gas in real time, based on a continuous change in the level of the chemical solution C. For example, the chemical supply device 100 may determine a reduced amount of the chemical solution C in real time, and may increase the target flow rate of the input gas in real time to correspond to the reduced amount of the chemical solution C, and may uniformly maintain a flow rate of an output gas. The controller 1001 may transmit, to the gas supply unit 160 and/or the valve module 110, a signal for controlling the target flow rate of the input gas to correspond to the level information of the chemical solution C acquired from the level sensor 1010, by using a program stored in the memory 1002.

Figure 10:
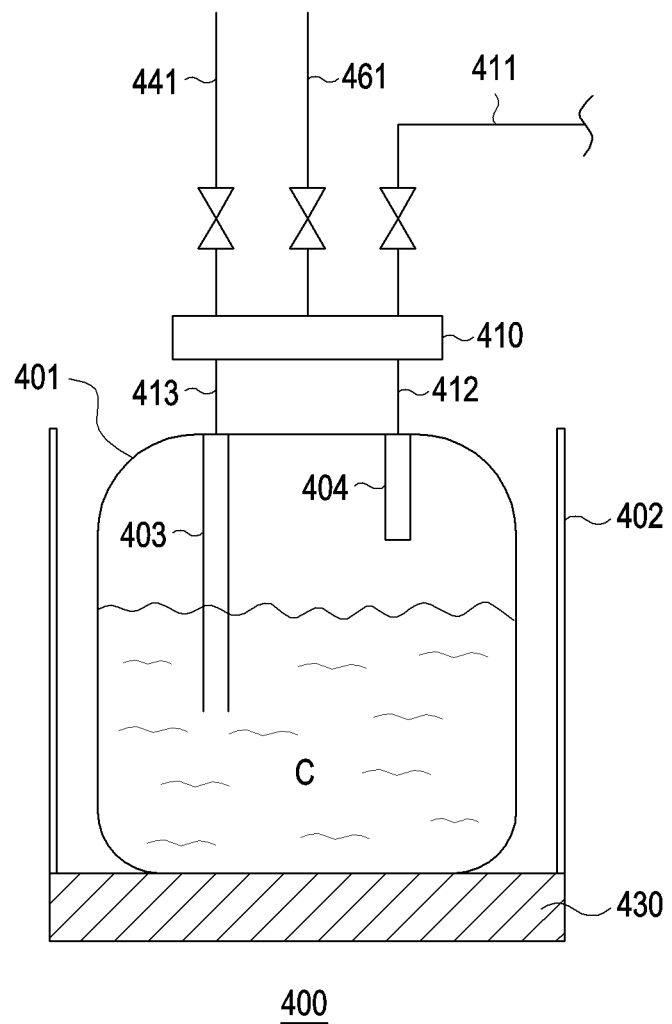
FIG. 10 is a view illustrating an implementation example of a chemical supply device according to a second embodiment.

FIG. 10 is a view illustrating an implementation example of a chemical supply device according to a second embodiment.

Referring to FIG. 10, the chemical supply device 400 may include all or part of a constant-temperature bath 402, a bubbler 401, a level sensor 430, and a valve module 410. Explanation of the chemical supply device 100, 200, 300 in the above-described embodiments may be applied to the chemical supply device 400 of FIG. 10.

According to various embodiments, the chemical supply device 400 may determine a level or a remaining amount of the chemical solution C, based on a weight. According to various embodiments, the level sensor 430 may be disposed under the bubbler 401. In an embodiment, the level sensor 430 may be disposed on a certain area of the constant-temperature bath 402 supporting a lower surface of the bubbler 401. According to various embodiments, the level sensor 430 may measure a weight of the bubbler 401. In an embodiment, the level sensor 430 may measure the weight of the bubbler 401 containing the chemical solution C, and may transmit the weight of the bubbler 401 that is consecutively reduced as the chemical solution C is vaporized to the controller 1001. In a certain embodiment, the controller 1001 may determine a remaining amount of the chemical solution C in the bubbler 401, based on weight information of the bubbler 401. In another example, the controller 1001 may determine a level (water level) of the chemical solution C, based on the weight information of the bubbler 401.

In a certain embodiment, when an input gas is introduced into the chemical solution C through an inlet tube 403 and the chemical solution C starts vaporizing, a vortex may be generated in the chemical solution C. When the vortex is generated, the surface of the chemical solution C may shake. Even when a height to the surface of the chemical solution C is changed, the weight of the inside of the bubbler 401 (including the chemical solution C) may be uniform, and accordingly, the chemical supply device 400 may exactly determine a level or remaining amount of the chemical solution C.

According to various embodiments, the memory 1002 may store calibration information of the level sensor 430. For example, the calibration information may include the weight of the bubbler 401 that does not contain the chemical solution C. In addition, the calibration information may include a measurement value of the level sensor 430 that is measured when there is no chemical solution C. In a certain embodiment, the bubbler 401 may be provided as a removable or replaceable configuration. In this case, the controller 1001 may detect the bubbler 401 mounted, and may perform a calibration operation to set an initial value of the level sensor 430.

Figure 11:
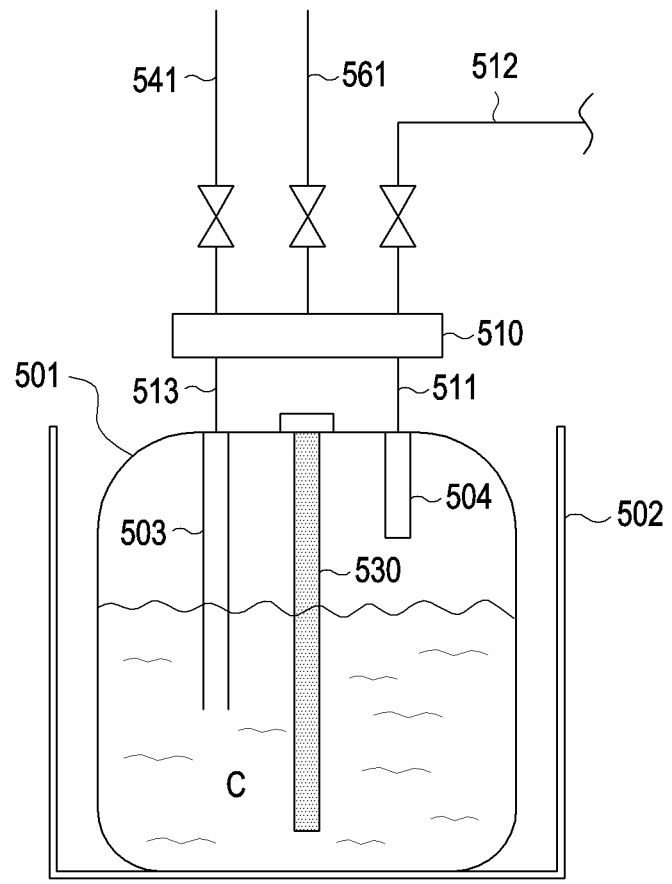
FIG. 11 is a view illustrating an implementation example of a chemical supply device according to a third embodiment.

FIG. 11 is a view illustrating an implementation example of a chemical supply device according to a third embodiment.

Referring to FIG. 11, the chemical supply device 500 may include all or part of a bubbler 501, a level sensor 530, a constant-temperature bath 502, and a valve module 510. The chemical supply device 500 of FIG. 11 may have the same configuration as that of the chemical supply device 100, 200, 400 of the above-described embodiments in its entirety or in part.

According to various embodiments, the level sensor 530 may contact a chemical solution C and may detect a level of the chemical solution C. In an embodiment, the level sensor 530 may be provided in a capacitive method (for example, a capacitance sensor).

In an embodiment, the level sensor 530 may be mounted in an upper area of the bubbler 501. In addition, the level sensor 530 may be physically and/or electrically connected with the valve module 510. The level sensor 530 may transmit the measured level of the chemical solution C to the valve module 510 and/or the controller 1001. The controller 1001 may determine a target flow rate of an input gas based on the level value received from the level sensor 530.

Figure 12:
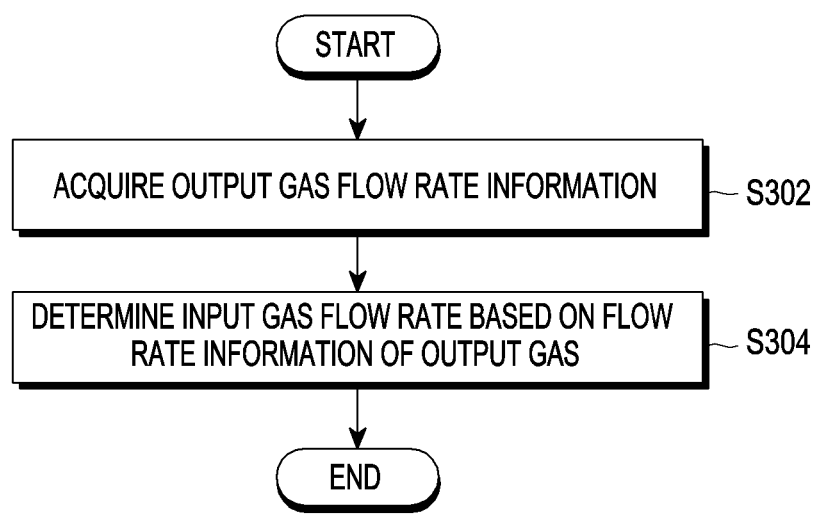
FIG. 12 is a flowchart illustrating an operating method of a chemical supply device according to still another embodiment.
Figure 13:
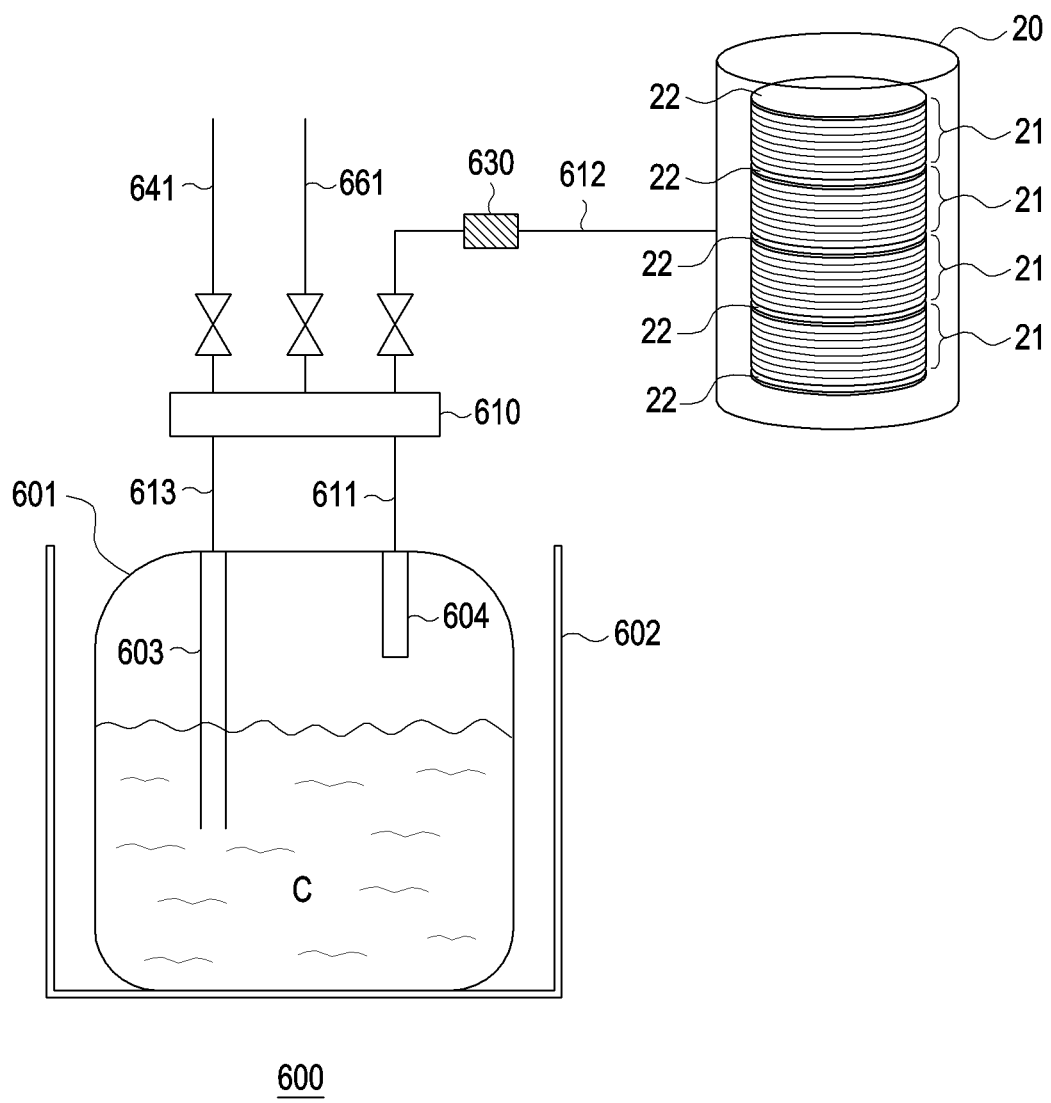
FIG. 13 is a view illustrating an implementation example of a chemical supply device according to a fourth embodiment.

FIG. 12 is a flowchart illustrating an operating method of a chemical supply device according to still another embodiment. FIG. 13 is a view illustrating an implementation example of a chemical supply device according to a fourth embodiment.

Referring to FIGS. 12 and 13, the operating method of the chemical supply device 100 may include a step of acquiring flow rate information of an output gas (S302), and a step of determining a target flow rate of an input gas based on the flow rate information of the output gas (S304).

According to various embodiments, the chemical supply device 600 may further include a flow rate sensor 630. Explanation of the chemical supply device 100, 200, 400, 500 in the above-described embodiments may be applied to the chemical supply device 600 of FIG. 13.

According to various embodiments, the flow rate sensor 630 may be disposed between the chemical supply device 600 and a process line 612. In an embodiment, the flow rate sensor 630 may be disposed in the process line 630, and may measure a flow rate of an output gas discharged from the bubbler 601. The flow rate sensor 630 may transmit information related to the flow rate of the output gas to the controller 1001. The controller 1001 may adjust the target flow rate of the input gas, based on the flow rate information of the output gas. For example, the controller 1001 may adjust the target flow rate of the input gas, such that the flow rate of the output gas corresponds to a designated flow rate. In an embodiment, the flow rate sensor may include a flowmeter.

According to various embodiments, the chemical supply system 10 may detect an error in the semiconductor manufacturing process, based on the flow rate information of the output gas acquired at the flow rate sensor 630. Hereinafter, an operation of detecting an error of the chemical supply system 10 by using the flow rate sensor will be described with reference to the drawings.

Figure 14:
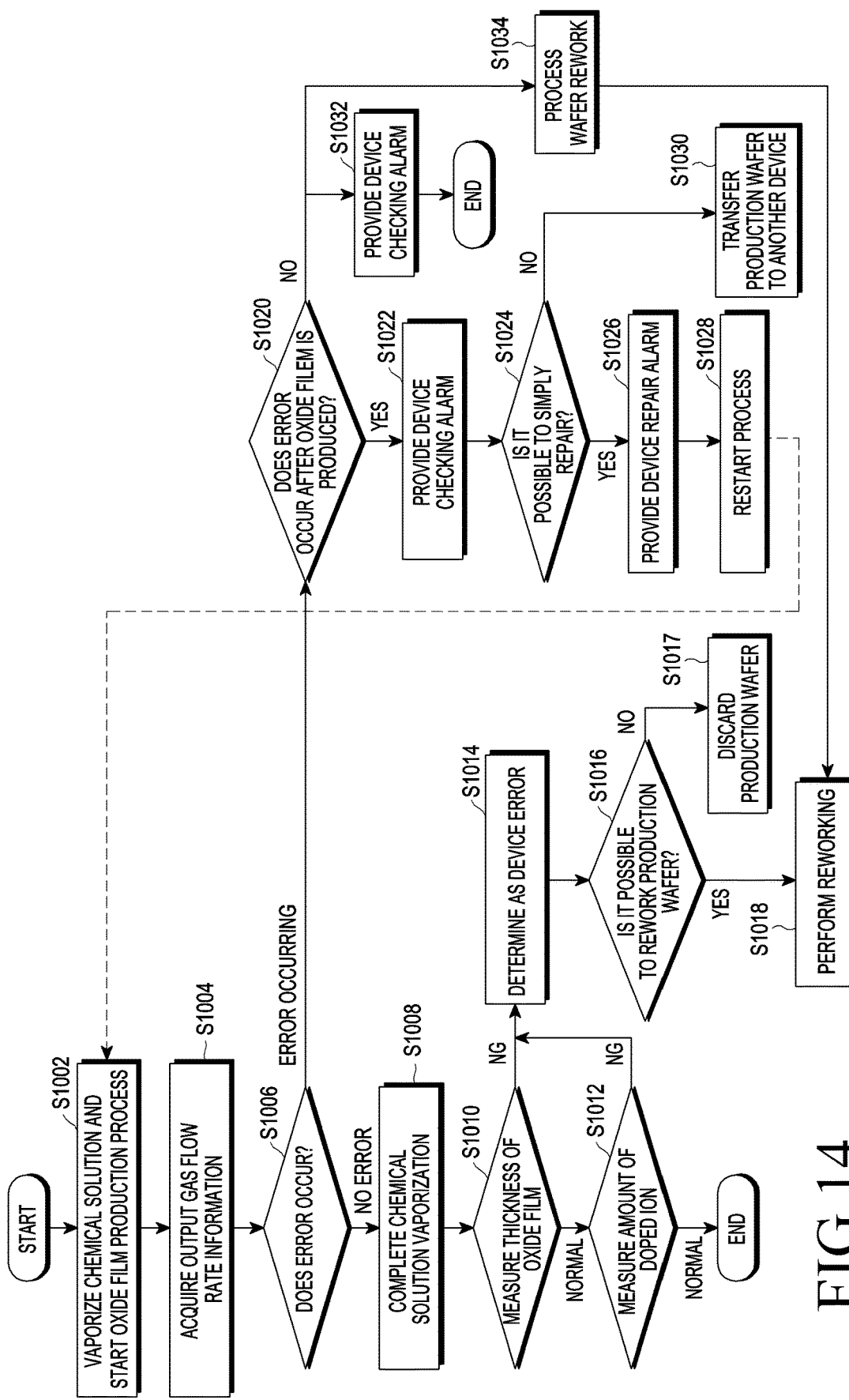
FIG. 14 is a flowchart illustrating an operating method of a chemical supply system according to yet another embodiment.

FIG. 14 is a flowchart illustrating an error detection operating method of a chemical supply system according to yet another embodiment. In explaining FIG. 14, FIG. 13 may also be referred to.

Hereinafter, the disclosure will be described with reference to FIGS. 13 and 14.

According to various embodiments, the chemical supply device 100 may be supplied with an input gas for vaporizing the chemical solution C from the gas supply unit 140, and may start a process of producing an oxide film in the process equipment 20 (S1002). Herein, the process equipment 20 may have semiconductor production wafers 21 stacked therein, and may perform a process of producing an oxide film on the stacked production wafers 21. Measurement wafers 22 may be additionally disposed on an upper portion and a lower portion of the production wafers 21. In an embodiment, the chemical solution C contained in the bubbler 601 may be vaporized and the output gas may be transferred to a valve module 610 through an outlet tube 604 and an outline line 611. The valve module 610 may adjust an internal channel to be fluidically connected with the process line 612, and the output gas may be introduced into the process equipment 20 through the flow rate sensor 630 to be used in a processing process of the production wafer 21.

While the output gas is transferred to the process equipment 20 along the process line 612, the flow rate sensor 630 may measure a flow rate of the output gas (S1004). Information on the measured flow rate of the output gas may be transmitted to the controller 1001.

According to various embodiments, the controller 1001 may determine whether there exists an error in the vaporized amount of the output gas, based on the information on the flow rate of the output gas (S1006). In an embodiment, the controller 1001 may compare the flow rate of the output gas and a designated (target) flow rate. Herein, when it is determined that the flow rate of the output gas measured at the flow rate sensor 630 falls within a designated flow rate range, the controller 1001 may continue introducing the input gas and proceeding with the process. When the process is sufficiently performed, the controller 1001 may stop introducing the input gas and complete vaporizing the chemical solution (S1008).

According to various embodiments, when the vaporization of the chemical solution C is completed, the process equipment 20 may measure a thickness of the oxide film formed on the production wafer 21. When a normal thickness of the oxide film is measured, the processor equipment 20 may measure an amount of ion doped on the production wafer 21 (S1012). When a normal amount of ion doped on the production wafer 21 is measured, the process equipment 20 may finish the oxide film forming process.

According to various embodiments, when an error occurs in the flow rate of the output gas, the chemical supply system 10 may determine whether the error occurs after the oxide film is formed on the production wafer 21 (S1020). In an embodiment, the process equipment 20 may measure whether an oxide film is produced on the wafers 21, 22 stacked therein. Herein, the process equipment 20 may use the measurement wafer 22.

According to various embodiments, when there exists an error in the flow rate of the output gas and an oxide film is not produced on the wafer 21, 22, the controller 1001 may provide an error occurrence alarm (or a device checking alarm) (S1022). Herein, the error may be divided into a low flow error that occurs when the flow rate of the output gas is smaller than the designated flow rate range, and an over flow error that occurs when the flow rate of the output gas is larger than the designated flow rate range.

In an embodiment, when the low flow error occurs, the controller 1001 may provide an indication indicating that the flow rate of the output gas is low to the outside. For example, the controller 1001 may provide an alarm requesting a safety valve disposed on the bubbler 601 to be closed. In another example, the controller 1001 may provide an alarm requesting release of interlocking occurring in the chemical supply device 600. The interlocking may occur in the valve module 610 or may occur in various channels (for example, the process line 612) connected with the process equipment 20. Herein, the interlocking may be caused by leakage of a gas occurring in the chemical supply device 600 or a gas supply line 641, or may be caused as an error when the chemical supply device 600 is checked. The interlocking may include interlocking caused by various factors. In another example, the controller 1001 may provide an alarm requesting cleaning of a channel (for example, a gas supply line 661) connected with the bubbler 601 and/or the process equipment 20, the chemical supply line 641, the process line 612, and/or the valve module 610.

According to various embodiment, the chemical supply system 10 may determine whether the error in the flow rate of the output gas is simply corrected (S1024). For example, when it is determined that the low flow error is caused by opening of the safety valve, the chemical supply device 600 may determine that it is possible to simply correct the error in the flow rate of the output gas. Herein, the chemical supply device 600 may receive an input of a cause of the low flow error through a separate input module (not shown) through which a user's input is received. When it is determined that it is possible to correct the error in the flow rate of the output gas, the chemical supply device 600 may provide an alarm for correcting (S1026) and may restart the process when the error is corrected (S1028).

In a certain embodiment, when it is determined that it is impossible to simply correct the error in the flow rate of the output gas, the chemical supply system 10 may provide an alarm to transfer the wafers 21, 22 stacked in the process equipment 20 to another process equipment 20 (S1030).

According to various embodiments, when it is determined that the error in the flow rate of the output gas occurs before the oxide film is produced, the chemical supply system 10 may provide an alarm for checking the device (S1032). The contents of step S1022 described above may be applied to the step S1032 of providing the alarm for checking the device. In addition, the chemical supply system 10 may provide an alarm indicating reworking of the wafer (S1034). In response to the alarm, the user may perform a rework process of the wafer 21, 22 (S1018). The wafer rework process will be described below.

According to various embodiments, when it is determined that the thickness of the oxide film formed on the wafer 21, 22 or the amount of doped ion is not appropriate at step S1010 and/or step S1012, the chemical supply system 10 may determine that there is an error in the chemical supply device 600 or the process equipment 20. Herein, the chemical supply system 10 may determine whether it is possible to rework the production wafer 21 (S1016), and, when it is possible to rework, the chemical supply system 10 may instruct to rework the production wafer 21 (S1018). On the other hand, when it is determined that it is impossible to rework, the chemical supply system 10 may instruct to discard the production wafer 21 (S1017).

Figure 15:
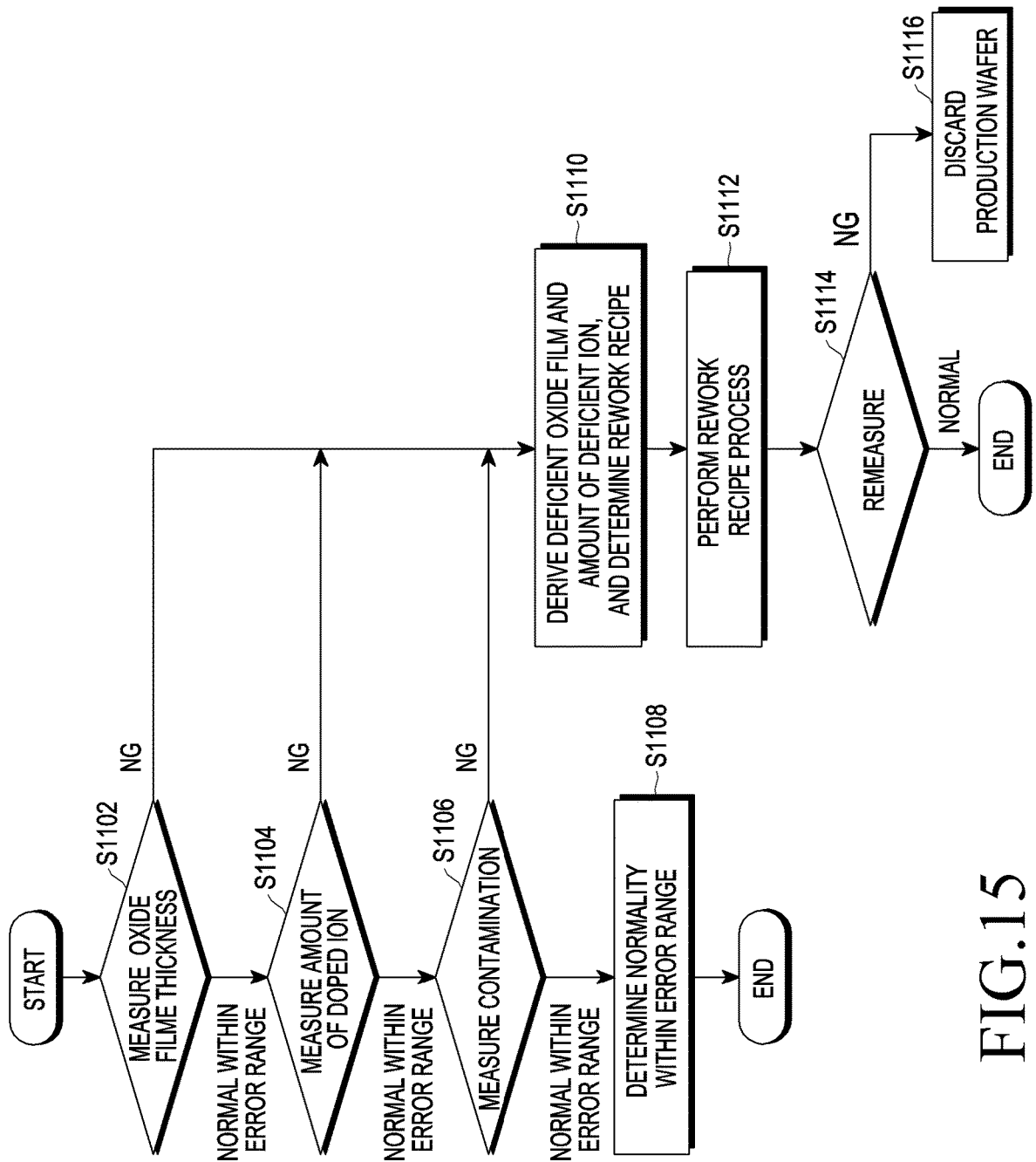
FIG. 15 is a flowchart illustrating a rework performing method according to various embodiments.

FIG. 15 is a flowchart illustrating a rework performing method according to various embodiments.

Hereinafter, the disclosure will be described with reference to FIG. 15. In explaining FIG. 15, reference numerals of FIG. 13 may also be mentioned.

According to various embodiments, the chemical supply system 10 may measure a thickness of an oxide film formed on the wafer 21, 22 (S1102). When it is determined that the thickness of the oxide film is normal within an error range, the chemical supply system 10 may measure an amount of doped ion (S1104). When it is determined that the amount of doped ion is normal within an error range, a degree of contamination may be measured (S1106). In other words, the chemical supply system 10 may measure the thickness of the oxide film formed on the wafer 21, 22, the amount of doped ion, and/or the degree of contamination in sequence, and, when there is no abnormality, the chemical supply system 10 may determine that reworking of the wafer 21, 22 is normal (S1106).

According to various embodiments, when it is determined that at least one of the thickness of the oxide film formed on the wafer 21, 22, the amount of doped ion and/or the degree of contamination is abnormal, the chemical supply system 10 may derive an amount (thickness) of the deficient oxide film and/or an amount of deficient ion, or may determine whether a rework recipe is appropriately set (S1110). Herein, the chemical supply system 10 may provide information on the amount (thickness) of the deficient oxide film or the amount of deficient ion to the outside, so that a user is induced to modify the recipe. In addition, the chemical supply system 10 may analyze a pre-stored process recipe and may generate a rework recipe for increasing the thickness of the oxide film or the amount of ion.

According to various embodiments, the chemical supply system 10 may perform the process based on a rework recipe that is newly inputted by the user and/or a rework recipe that is newly generated in the chemical supply system 10 (S1112). After the rework process, the chemical supply system 10 may remeasure whether the process is appropriately performed on the wafer 21, 22 (S1114). The step of remeasuring (S1114) may include all or part of steps S1102, S1104, S1106 described above. When a defect is identified at the step of remeasuring (S1114), the chemical supply system 10 may discard the wafer 21, 22.

Figure 16:
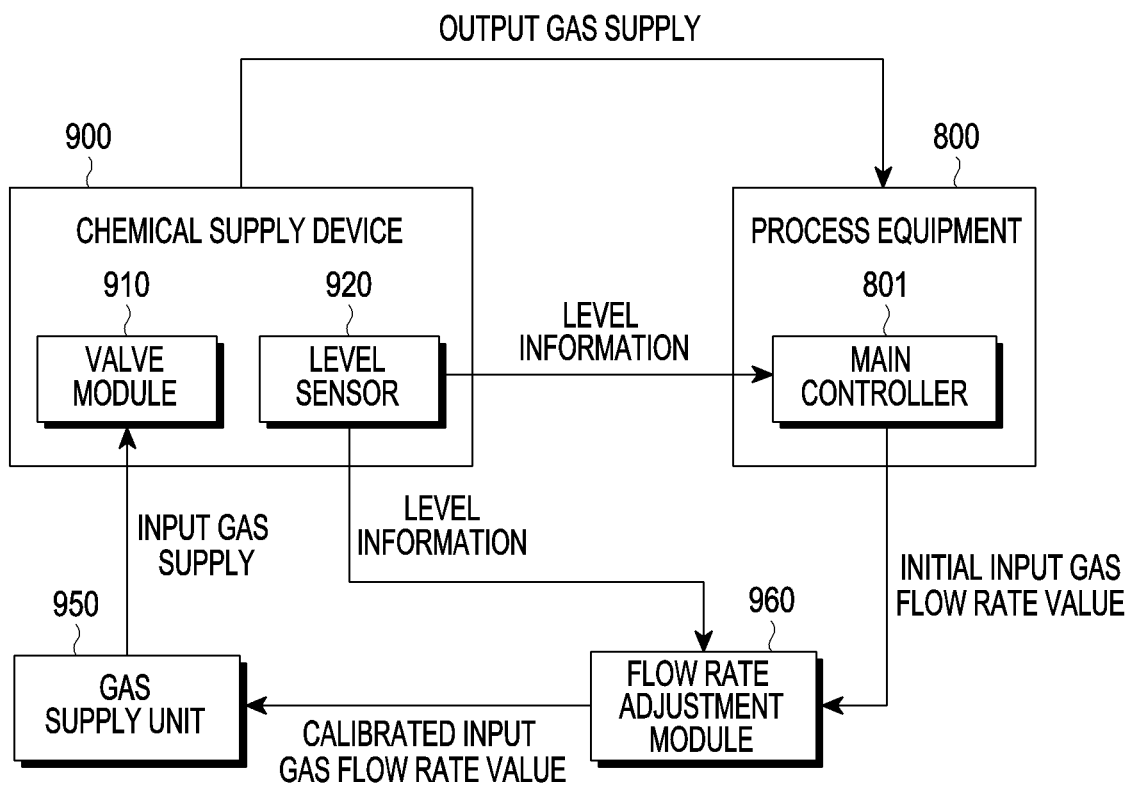
FIG. 16 is a block diagram of a chemical supply system according to a further embodiment.

FIG. 16 is a block diagram of a chemical supply system according to a further embodiment.

Referring to FIG. 16, the chemical supply system 90 according to the further embodiment may include all or part of a chemical supply device 900, process equipment 800, a gas supply unit 950, and a flow rate adjustment module 960. Explanation of the chemical supply device 100, 200, 400, 500, 600, the process equipment 20, and the gas supply unit 160 in the above-described embodiments may be applied to the chemical supply device 900, the process equipment 800, and the gas supply unit 950 of FIG. 16.

In a certain embodiment, the chemical supply system 90 may include a main controller 801 in the process equipment 800 to control the chemical supply system 90. Herein, the chemical supply system 90 may further include a controller (for example, the controller 1001 of FIG. 3) to control the chemical supply device 900, and the chemical supply device (for example, the controller 1001 of FIG. 3) may be integrated and may be provided as the main controller 801. In a certain embodiment, the chemical supply device 900 may be replaceable. For example, when the process equipment 801 and the chemical supply device 900 are manufactured by different manufacturers, there may be a need for compatibility between the chemical supply device 900 and the process equipment 800. In a certain embodiment, the main controller 801 may receive level information of a remaining chemical solution C from a level sensor 920, and may transmit a signal for adjusting a flow rate of an input gas to the gas supply unit 950 based on the level information. However, when the main controller 801 does not include a program for controlling the flow rate of the input gas, a flow rate adjustment module for precisely controlling the target flow rate of the input gas may further be required.

Since the process equipment 800 normally instructs the gas supply unit 950 to supply the input gas at a constant flow rate, it is necessary to determine an exact flow rate of the input gas based on the level of the remaining chemical solution C.

According to various embodiments, the flow rate adjustment module 960 may be connected between the process equipment 800 and the gas supply unit 950. In an embodiment, the flow rate adjustment module 960 may receive an initial input gas flow rate value from the main controller 801. Herein, the initial input gas flow rate value may refer to a flow rate value of the input gas that the main controller 801 receives and acquires from the level sensor 920. In a certain embodiment, the initial input gas flow rate value may not reflect the level information of the remaining chemical solution C.

According to various embodiment, the flow rate adjustment module 960 may acquire the level information of the remaining chemical solution C from the level sensor 920. The flow rate adjustment module 920 may determine a calibrated input flow rate value (target flow rate), based on the level information of the remaining chemical solution C. In another example, the flow rate adjustment module 920 may determine the calibrated input gas flow rate value (target flow rate) by calibrating the initial input gas flow rate value based on the level of the remaining chemical solution C. The flow rate adjustment module 960 may transmit the target flow rate to the gas supply unit 950, and the gas supply unit 950 may transfer the input gas to a valve module 910 to correspond to the target flow rate. Herein, the flow rate adjustment module 960 may determine the target flow rate based on both the initial input gas flow rate value and the level information. In another example, the flow rate adjustment module 960 may determine the target flow rate based on only the level information without the information on the initial input gas flow rate value.

In other words, when the chemical supply device 900 is newly mounted in the existing process equipment 800 which is not capable of controlling the flow rate of the input gas according to the level of the remaining chemical solution C, the flow adjustment module 960 disposed between the main controller 801 and the gas supply unit 950 may perform an operation for controlling the flow rate of the input gas. Accordingly, even when old process equipment 20 or process equipment of a different manufacturer is used, the target flow rate of the input gas may be precisely adjusted by using the level sensor 920, and the flow rate of the output gas may be uniformly controlled.

Figure 17:
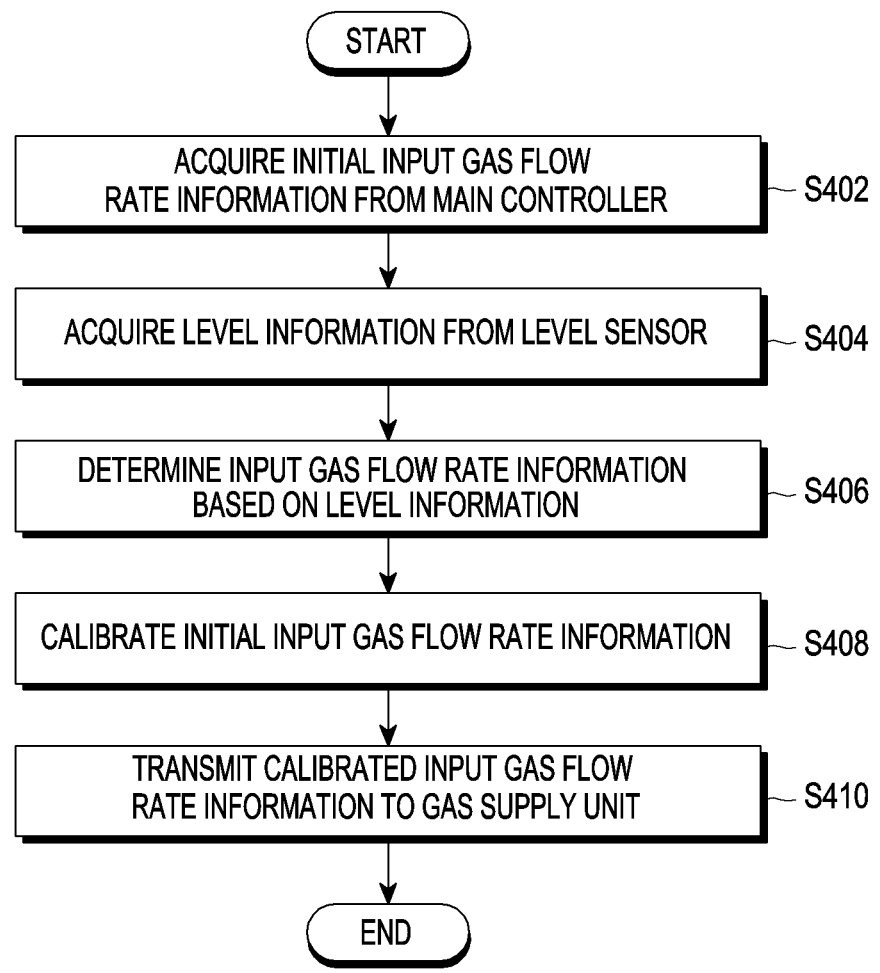
FIG. 17 is a flowchart illustrating a method for adjusting a flow rate of an input gas in the chemical supply system of FIG. 16.

FIG. 17 is a flowchart illustrating an input gas flow rate adjustment method of the chemical supply system of FIG. 16.

Referring to FIG. 17, the input gas flow rate adjustment method of the chemical supply system 90 may include a step of acquiring flow rate information of an initial input gas from the main controller 801 (S402), a step of acquiring level information from the level sensor 920 (S404), a step of determining flow rate information of an input gas based on the level information (S406), a step of calibrating the flow rate information of the initial input gas (S408), and a step of transmitting the calibrated input gas flow rate information to the gas supply unit (S410). In explaining FIG. 17, reference numerals of FIG. 16 may also be mentioned.

According to various embodiments, the chemical supply system 90 may acquire initial input gas flow rate information from the main controller 810 (S402). For example, the flow rate adjustment module 960 may receive flow rate information of the input gas that is stored in a memory (not shown) provided in the process equipment 800 and follows a process recipe from the main controller 801.

According to various embodiments, the chemical supply system 90 may acquire level information of the chemical solution C remaining in a bubbler (for example, the bubbler 102 of FIG. 2) from the level sensor 920 (S404). For example, the flow rate adjustment module 960 may be connected with the level sensor 920 and may acquire level information from the level sensor 920 and may determine a target flow rate (S406).

According to various embodiments, the chemical supply system 90 may calibrate the flow rate information of the initial input gas to correspond to the target flow rate (S408). In a certain embodiment, when compatibility information between the process equipment 800 and the chemical supply device 900 is not guaranteed (for example, when the process equipment 800 and the gas supply unit 950, and the chemical supply device 900 have different data formats), the flow rate adjustment module 960 may calibrate the initial input gas flow rate to the target flow rate to correspond to the format of the gas supply unit 950 and/or the process equipment 800.

According to various embodiments, the chemical supply system 90 may transmit the calibrated input gas flow rate information to the gas supply unit 950, and the gas supply unit 950 may transfer the input gas to the chemical supply device 900 based on the calibrated input gas flow rate (S410)

According to various embodiments, there is provided a chemical supply device including: a bubbler configured to contain a chemical solution which is used in a semiconductor process and to receive an input gas for vaporizing the chemical solution into an output gas; a constant-temperature bath configured to contain the bubbler and to adjust a temperature of the chemical solution; a valve module fluidically connected with the bubbler and configured to provide channels for the chemical solution, the input gas, and the output gas; a level sensor configured to detect a remaining level of the chemical solution contained in the bubbler; a controller; and a memory configured to store a program for operating the controller, wherein the controller is configured to determine a target flow rate of the input gas to cause a flow rate of the output gas to have a designated flow rate, based on the remaining level of the chemical solution which is acquired from the level sensor.

According to an embodiment, the level sensor may include a light emitter and a light receiver which is configured to measure an intensity of light that enters from the light emitter while passing through the bubbler, and the controller may be configured to determine a level of the chemical solution based on the intensity of the light measured at the light receiver.

According to an embodiment, the light emitter may include a first light emitter and a second light emitter, the light receiver may include a first light receiver and a second light receiver, the first light emitter may be disposed at a same height as the first light receiver, and the second light emitter may be disposed at a same height as the second light receiver.

According to an embodiment, the level sensor may further include a light conversion member, and the light conversion member may be disposed between the bubbler and the light emitter.

According to an embodiment, the light conversion member may include: a light collector disposed close to the light emitter and configured to collect light outputted from the light emitter; and an adjuster connected with the light collector and configured to adjust a light path to transmit the light collected at the light collector to the light receiver.

According to an embodiment, the level sensor may be disposed under the bubbler and may be configured to measure a weight of the bubbler.

According to an embodiment, the controller may be configured to further perform a calibration operation based on an initial weight of the bubbler.

According to an embodiment, the level sensor may include a capacitance sensor configured to measure a level of the chemical solution in contact with the chemical solution.

According to an embodiment, the controller may be configured to determine a level of the chemical solution, based on initial level data stored in the memory and sensing data acquired from the level sensor.

According to an embodiment, the level sensor may be configured to measure a flow rate of the output gas, and the controller may be configured to determine the target flow rate based on the flow rate of the output gas.

According to various embodiments, there is provided a chemical supply system including: a chemical supply device, the chemical supply device including: a bubbler configured to contain a chemical solution which is used in a semiconductor process and to receive an input gas for vaporizing the chemical solution into an output gas; a constant-temperature bath configured to contain the bubbler and to adjust a temperature of the chemical solution; and a valve module fluidically connected with the bubbler and configured to provide channels for the chemical solution, the input gas, and the output gas; a gas supply unit configured to store the input gas to be introduced into the bubbler and connected with the bubbler; a chemical supply unit configured to store the chemical solution to be introduced into the bubbler; and process equipment fluidically connected with the bubbler through a process line to receive the output gas and perform a process; a flow rate sensor fluidically connected between the valve module and the bubbler and configured to measure a flow rate of the output gas transmitted to the process equipment; and a controller, wherein the controller is configured to determine an error of the chemical supply device based on flow rate information of the output gas which is acquired from the flow rate sensor.

According to an embodiment, the error may include a low flow error indicating that the flow rate of the output gas is lower than a designated flow rate range, and an over flow error indicating that the flow rate of the output gas is larger than the designated flow rate range, and the controller may determine at least one of the low flow error and the over flow error.

According to an embodiment, when it is determined that the error is the low flow error, the controller may be configured to instruct to change an opening and closing state of a safety valve which is provided in the bubbler.

According to an embodiment, when it is determined that the error is the low flow error, the control may be configured to instruct to release interlocking of the valve module.

According to an embodiment, when it is determined that the error is the over flow error, the controller may be configured to provide an alarm for instructing to repair the valve module.

According to an embodiment, the controller may be configured to adjust a flow rate of the input gas that is introduced into the bubbler, based on the flow rate information of the output gas.

According to an embodiment, when it is determined that there is an error in the flow rate information of the output gas, the controller may be configured to determine a time when the error occurs.

According to an embodiment, when the error occurs before an oxide film of the wafer is formed, the controller may be configured to provide an alarm for restarting the process.

According to an embodiment, when the error occurs after the oxide film of the wafer is formed, the controller may be configured to instruct to discard the wafer.

According to an embodiment, when the error occurs after the oxide film of the wafer is formed, the controller may be configured to instruct to perform a rework process of the wafer.

According to various embodiments, there is provided a chemical supply system including: a chemical supply device, the chemical supply device including: a bubbler configured to contain a chemical solution which is used in a semiconductor process and to receive an input gas for vaporizing the chemical solution into an output gas; a valve module fluidically connected with the bubbler and configured to provide channels for the chemical solution, the input gas, and the output gas; and a level sensor configured to detect a remaining level of the chemical solution contained in the bubbler; a gas supply unit configured to store the input gas to be introduced into the bubbler and connected with the bubbler; and a flow rate adjustment module electrically connected with the level sensor and the gas supply unit, wherein the flow rate adjustment module is configured to determine a target flow rate of the input gas based on level information of the chemical solution acquired from the level sensor, and to transmit information related to the target flow rate to the gas supply unit, such that the input gas corresponding to the target flow rate is supplied.

According to an embodiment, the chemical supply system may further include process equipment connected with the valve module through a process line and configured to receive the output gas and perform a process.

According to an embodiment, the process equipment may further include a controller configured to transmit initial flow rate information of the input gas to the gas supply unit.

According to an embodiment, the flow rate adjustment module may be electrically connected between the controller and the gas supply unit, and may be configured to receive the initial flow rate information from the controller and to calibrate the initial flow rate information into the target flow rate information.

According to an embodiment, the flow rate adjustment module may be configured to determine a level of the chemical solution based on initial level data stored in a memory and sensing data acquired from the level sensor.

According to an embodiment, the level sensor may include a light emitter and a light receiver which is configured to measure an intensity of light that enters from the light emitter while passing through the bubbler, and the controller may be configured to determine the level of the chemical solution based on the intensity of the light measured at the light receiver.

According to an embodiment, the light emitter may include a first light emitter and a second light emitter, the light receiver may include a first light receiver and a second light receiver, the first light emitter may be disposed at a same height as the first light receiver, and the second light emitter may be disposed at a same height as the second light receiver.

According to an embodiment, the level sensor may further include a light conversion member, and the light conversion member may be disposed between the bubbler and the light emitter.

According to an embodiment, the chemical supply system may further include a constant-temperature bath configured to contain the bubbler and to adjust a temperature of the chemical solution According to an embodiment, the chemical supply system may further include a chemical supply unit configured to store the chemical solution and fluidically connected with the valve module, and the controller may be configured to transmit a refill signal of the chemical solution to the chemical supply unit based on the level information.

Although the embodiments have been described with reference to specified embodiments and drawings as described above, various modifications and changes may be made from the above descriptions by a person skilled in the art. For example, even when the above-described technologies are performed in a different order from that described above, and/or components of the above-described structure, device, etc. are coupled or combined in different forms from that described above, or are replaced or substituted with other components or equivalents, appropriate results may be achieved.

Therefore, other implementations, other embodiments, and equivalents to the scope of the claims belong to the scope of the claims presented below.

What is claimed is:
1. A chemical supply device comprising:
a bubbler configured to contain a chemical solution which is used in a semiconductor process and to receive an input gas for vaporizing the chemical solution into an output gas;
a constant-temperature bath configured to contain the bubbler and to adjust a temperature of the chemical solution;
a valve module fluidically connected with the bubbler and configured to provide channels for the chemical solution, the input gas, and the output gas;
a level sensor configured to detect a remaining level of the chemical solution contained in the bubbler;
a controller; and
a memory configured to store a program for operating the controller,
wherein the controller is configured to determine a target flow rate of the input gas to cause a flow rate of the output gas to have a designated flow rate, based on the remaining level of the chemical solution which is acquired from the level sensor.
2. The chemical supply device of claim 1, wherein the level sensor comprises a light emitter and a light receiver which is configured to measure an intensity of light that enters from the light emitter while passing through the bubbler, and wherein the controller is configured to determine a level of the chemical solution based on the intensity of the light measured at the light receiver.

3. The chemical supply device of claim 2, wherein the light emitter comprises a first light emitter and a second light emitter,
   wherein the light receiver comprises a first light receiver and a second light receiver,
   wherein the first light emitter is disposed at a same height as the first light receiver, and
   wherein the second light emitter is disposed at a same height as the second light receiver.

4. The chemical supply device of claim 2, wherein the level sensor further comprises a light conversion member, and
   wherein the light conversion member is disposed between the bubbler and the light emitter.

5. The chemical supply device of claim 4, wherein the light conversion member comprises:
   a light collector disposed close to the light emitter and configured to collect light outputted from the light emitter; and
   an adjuster connected with the light collector and configured to adjust a light path to transmit the light collected at the light collector to the light receiver.

6. The chemical supply device of claim 1, wherein the level sensor is disposed under the bubbler and is configured to measure a weight of the bubbler.

7. The chemical supply device of claim 6, wherein the controller is configured to further perform a calibration operation based on an initial weight of the bubbler.

8. The chemical supply device of claim 1, wherein the level sensor comprises a capacitance sensor configured to measure a level of the chemical solution in contact with the chemical solution.

9. The chemical supply device of claim 1, wherein the controller is configured to determine a level of the chemical solution, based on initial level data stored in the memory and sensing data acquired from the level sensor.

10. The chemical supply device of claim 1, wherein the level sensor is configured to measure a flow rate of the output gas, and
    wherein the controller is configured to determine the target flow rate based on the flow rate of the output gas.

* * * * *